United States Patent
Ando et al.

(10) Patent No.: US 6,724,018 B2
(45) Date of Patent: Apr. 20, 2004

(54) ZN1-XMGXSYSE1-Y PIN-PHOTODIODE AND ZN1-XMGXSYSE1-Y AVALANCHE-PHOTODIODE

(75) Inventors: Koshi Ando, Tottori (JP); Takao Nakamura, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 4 days.

(21) Appl. No.: 10/228,289

(22) Filed: Aug. 27, 2002

(65) Prior Publication Data

US 2003/0067011 A1 Apr. 10, 2003

(30) Foreign Application Priority Data

Sep. 6, 2001 (JP) .......................... 2001-270031
Oct. 23, 2001 (JP) .......................... 2001-324341

(51) Int. Cl.[7] .......................... H01L 31/0328
(52) U.S. Cl. .................. 257/186; 257/199; 257/438; 257/458; 257/481; 257/656
(58) Field of Search ................ 257/430, 458, 257/656, 199, 186, 438, 492

(56) References Cited

U.S. PATENT DOCUMENTS 6,147,391 A * 11/2000 Bowers et al. .............. 257/458
6,528,395 B2 * 3/2003 Nakamura .................. 438/478

FOREIGN PATENT DOCUMENTS

| JP | 60-198786 | 10/1985 |
| JP | 2-262379 | 10/1990 |

* cited by examiner

Primary Examiner—Long Pham
Assistant Examiner—Wai-Sing Louie
(74) Attorney, Agent, or Firm—Smith, Gambrell & Russell, LLP

(57) ABSTRACT

A blue-violet-near-ultraviolet pin-photodiode with small dark current, high reliability and long lifetime. The pin-photodiode has a metallic n-electrode, a n-ZnSe single crystal substrate, an optionally added n-ZnSe buffer layer, an n-$Zn_{1-x}Mg_xS_ySe_{1-y}$ layer, an i-$Zn_{1-x}Mg_xS_ySe_{1-y}$ layer, a p-$Zn_{1-x}Mg_xS_ySe_{1-y}$ layer, a p-$(ZnTe/ZnSe)^m$ SLE, a p-ZnTe contact layer, an optionally provided antireflection film and a metallic p-electrode.

A blue-violet-near-ultraviolet avalanche photodiode with small dark current, high reliability and long lifetime. The avalanche photodiode has a metallic n-electrode, a n-ZnSe single crystal substrate, an optionally added n-ZnSe buffer layer, an n-$Zn_{1-x}Mg_xS_ySe_{1-y}$ layer, an i-$Zn_{1-x}Mg_xS_ySe_{1-y}$ layer, a p-$Zn_{1-x}Mg_xS_ySe_{1-y}$ layer, a p-$(ZnTe/ZnSe)^m$ SLE, a p-ZnTe contact layer, an optionally provided antireflection film and a metallic p-electrode. Upper sides of the layered structure are etched into a mesa-shape and coated with insulating films.

22 Claims, 24 Drawing Sheets

Fig.4  EMBODIMENT 1

Fig.6
chemical vapor transport method
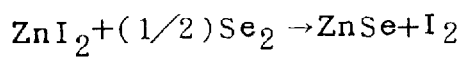
$ZnI_2 + (1/2)Se_2 \rightarrow ZnSe + I_2$
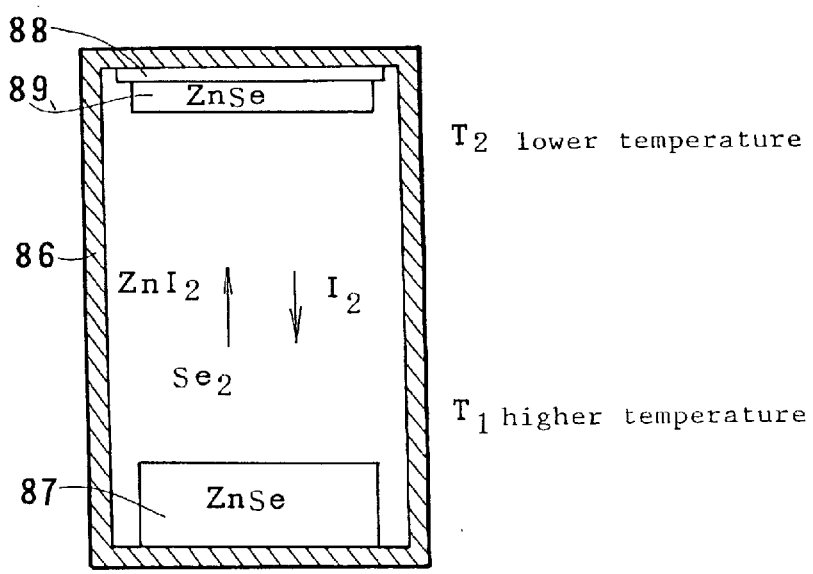
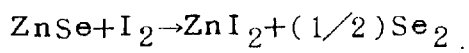
$ZnSe + I_2 \rightarrow ZnI_2 + (1/2)Se_2$ molecular beam epitaxial growth apparatus

EMBODIMENT 2

Fig.20 super lattice electrode structure

MQW(SLE)

| |
|---|
| p-ZnSe 2nm |
| p-ZnTe 1.5nm |
| p-ZnSe 2nm |
| p-ZnTe 1.2nm |
| p-ZnSe 2nm |
| p-ZnTe 0.9nm |
| p-ZnSe 2nm |
| p-ZnTe 0.6nm |
| p-ZnSe 2nm |
| p-ZnTe 0.3nm |

Fig.21 forward direction voltage/current character

Fig.25 electric field dependence of photocurrent amplifying rate (G)

EMBODIMENT 5

ZN1-XMGXSYSE1-Y PIN-PHOTODIODE AND ZN1-XMGXSYSE1-Y AVALANCHE-PHOTODIODE

BACKGROUND OF THE INVENTION

1. Field of the Invention

This invention relates to a pin-photodiode and an avalanche photodiode for sensing near-ultraviolet to blue rays. A photodetector is a sensor which receives light and generates a photocurrent output which is in proportion to the power of input light. A photodiode and a phototransistor having pn-junctions are photodetectors as solid state devices. A photoconductive device without a pn-junction senses the light power by photoconductive effects. Besides the semiconductor devices, there are a phototube or a photomultiplier photodetectors which make use of vacuum tubes.

The present invention relates to a near-ultraviolet-blue photodiode having a pn-junction.

This application claims the priority of Japanese Patent Applications No. 2001-270031 filed on Sep. 6, 2001 and No. 2001-324341 filed on Oct. 23, 2001, which are incorporated herein by reference.

Several kinds of photodiodes have been made and practically used for detecting light of various wavelength ranges. A purpose of the present invention is to provide a photodiode for sensing near-ultraviolet to blue rays of a wavelength between 460 nm and 300 nm. A more concrete purpose is to provide a photodiode for detecting light of a wavelength of 400 nm of HD-DVDs (high definition digital video disc) which will be manufactured and will be sold on the market in the near future.

This invention relates also to a blue-ultraviolet avalanche photodiode (APD) for sensing blue, violet and ultraviolet rays of a wavelength range between about 460 nm and 300 nm. An avalanche photodiode is a high-sensitive photodetector of avalanche-amplifying photocarriers by applying a high reverse bias slightly below a breakdown voltage upon a pn-junction. There has been no blue-ultraviolet avalanche photodiode till now. This invention gives such a blue-ultraviolet avalanche photodiode for the first time.

2. Description of Related Art

A CD (compact disc) and an MD (medium disc) have been widely employed as a recording media of music, movies or data. A CD player has a GaAs-type laser diode which emits near-infrared rays of a 780 nm long wavelength. Sales of the DVD players are going up at a rate of 300% a year. The present DVD players use another GaAs-type laser diode which emits red rays of 650 nm for reading-out data from DVD discs. Video-recorders which make use of rewritable DVD discs are on the market from the end of 1999. The shorter the wavelength of the light source of reading-out data from a DVD disc is, the drastically the data amount which can be stored in the DVD disc increases. Future progress of DVDs ardently desires still shorter wavelength light sources than the 650 nm GaAs-type lasers.

If a blue-violet laser diode of GaN (gallium nitride)-type is put on the market, the short wavelength light of 400 nm will be available for the light source of reading out data of DVDs.

In accordance with the appearance of 400 nm-emitting GaN-LDs on the market, commencement of sales of HD-DVDs which can record HD-TV for two hours is scheduled. Table 1 shows information capacity, recording hours, initially-manufactured years, colors of reading-out light source lasers, emission wavelengths of the lasers, materials of the lasers, kinds of photodetectors for the CD (compact disc), DVD (digital video disc), and HD-DVD (high definition digital video disc).

TABLE 1

Information capacity, recording hours, initially-manufactured years, colors of reading-out light source lasers, emission wavelengths and materials of lasers, kinds of photodetectors for CD, DVD, and HD-DVD

|  | CD | DVD | HD-DVD |
| --- | --- | --- | --- |
| Information capacity | 640 MB | 4.7 GB | 22.5 GB |
| Recording hours | Present TV 15 minutes | Present TV 2 hours | HD-TV 2 hours |
| Initially-manufactured year | From 1982 | From 1997 | From 2002 |
| Color of reading-out light source laser | Near-infrared | Red | Blue-violet |
| Emission wavelength | 780 nm | 650 nm | 405 nm |
| Material of laser | GaAs | GaAs | GaN |
| Kind of photodetector | Si-PD | Si-PD | ? |

In the materials on the table, the listed "GaAs" means not the light emitting layer (active layer) but the material of the substrate. Another listed "GaN" is neither the material of the active layer nor the substrate but the material of typical films (buffer layer, contacting layer, or cladding layer). The "GaN"-type laser diode has a sapphire as a substrate and an InGaN layer as an active layer.

The 400 nm HD-DVDs which will be put on the market in 2002 can enhance the memory density by five times as much as the prior 650 nm-DVD. The HD-DVDs will have a 22.5 GB memory capacity which enables a DVD player to record HD-DVD movies for two hours.

An avalanche photodiode is a semiconductor photodetector having an avalanche amplification function which applies a strong reverse bias to a pn-junction, making a strong electric field in depletion layers and the pn-junction, accelerates photocarriers generated by light at the depletion layers, inducing reciprocal collisions of the accelerating photocarriers to lattice atoms, and generating new carriers by the collisions. The avalanche photodiode is an excellent photodiode having a built-in amplification function in itself.

A sensitivity range of a photodiode, in general, is determined by bandgaps of a material of a light receiving layer. A photodiode has a peak sensitivity at an absorption edge wavelength of the material of the light receiving layer. The photodiode has no sensitivity for the light having a longer wavelength than the absorption edge wavelength. The photodiode has sensitivity for the light having a smaller wavelength than the absorption edge wavelength. But, the sensitivity decreases as the wavelength becomes far shorter than the absorption edge wavelength. The tendency is common to the avalanche photodiode (APD). A Si-APD (visible) and a Ge-APD (infrared) are actually on the market. Various type InP-APDs have been proposed (for example, Japanese Patent Laying Open No. 60-198786(198786/'85) and Japanese Patent Laying Open No. 2-262379(262379/'90). But, the InP-APDs (infrared) are unstable and unreliable yet.

A Si-APD has sensitivity for visible light and near-infrared rays of wavelength between 500 nm and 900 nm. A Ge-APD has sensitivity for near-infrared rays. Thus, the Ge-APD and the Si-APD can cover the wavelength range from visible to near-infrared rays. An InP-APD with an InGaAs sensing layer can sense a wavelength range from 1200 nm to 1650 nm. However, the Ge-APDs and the InP-APDs are not put into actual use unlike the Si-APDs.

The Si-APD is made upon a p-type Si substrate unlike other silicon devices which are made on n-type Si substrates. The Si-APD is produced by piling a thin p-Si layer upon the p-Si substrate, making an n-region by thermally diffusing n-type dopant into the p-layer, and making an n-type Si guardring around the n-region by thermal diffusion for stabilizing electric field distribution at a periphery. The Si-device made on the p-type substrate is quite strange, since other Si devices are all made upon n-type Si substrates. Silicon is an ideal semiconductor in which a p-region can be made as easily as an n-region and holes have a similar mobility and an effective mass to electrons. Other semiconductor materials are asymmetric regarding a p-region and an n-region, and a hole mass and an electron mass, and a hole mobility and an electron mobility and so on.

Ge devices which are, in general, suffering from a loose pn-junction has large leak current and big dark current flowing across the pn-junction. An application of a large reverse bias induces a large increase of the dark current in a Ge-APD. Thus, the Ge-APDs and InP-APDs are not in practical use. The Si-APD is a unique practical avalanche photodiode still now.

The matter of the present invention is not a laser diode as a light source of irradiating DVDs for reading-in data but a pin-photodiode and an avalanche photodiode of sensing the reflected reading out light. Inexpensive GaN-type (InGaN) laser diodes will be manufactured at low cost on mass scale as light sources in near future. The progress of photodiodes for sensing the irradiated data with high quantum efficiency does not coincide with the progress of the laser diodes.

Silicon photodiodes (Si-PDs) have been used for sensing the reflected light data by light source lasers of CD players (780 nm) and DVD players (650 nm). The silicon photodiodes (Si-PDs) which have high sensitivity for visible light and near-infrared rays are optimum for sensing the 780 nm light (CDs) and the 650 nm light (DVDs). The silicon photodiodes, however, are incompetent for sensing 400 nm light (HD-DVDs).

FIG. 2 shows a graph of the quantum efficiency of pin-PDs as a function of wavelength. The abscissa is a wavelength ($\mu$m) of light. The ordinate is theoretical optimized quantum efficiency (%). The graph shows the maximum efficiency for the diodes. All actual PDs have not such high sensitivity. Theoretical quantum efficiency of Si-PDs, Ge-PDs, InGaAs-PDs and AlGaAsSb-PDs are indicated. The most prevalent PDs for short wavelengths are Si-photodiodes. Silicon PD's theoretical quantum efficiency which has a peak at 800 nm is 85% at 780 nm (CDs) and 70% at 650 nm (DVDs).

The sensitivity of Si-PDs falls down to 35% at 500 nm. The Si-PDs have poor sensitivity at 400 nm. The prevalent Si-PDs for the current CDs and DVDs are fully incompetent for sensing violet-blue rays of about 400 nm.

The new 400 nm light HD-DVDs require new photodetecting devices instead of Si-PDs. Phototubes and photomultipliers having vacuum tubes coated with SbCs, NaKSbCs, or GaAs(Cs) have sensitivity for near-ultraviolet rays between 300 nm and 400 nm. The phototubes and the photomultipliers which are not solid state semiconductor devices are unsuitable as photodetectors of domestic DVD players, because of large volume, heavy weight, complicated high-voltage power sources, short lifetime and high cost.

CdS (cadmium sulfide) is well known as a photoconductive material having sensitivity for visible light. A photoconductive device having no pn-junction has a drawback of slow response. The CdS photoconductive device cannot be a photodetector for reading out the HD-DVD. The HD-DVD requires a pin-photodiode or a pn-photodiode having a special sensing material which has sufficient sensitivity for the ultraviolet rays of the 400 nm wavelength.

One candidate for the HD-DVD reading-out device is an improvement of a matured visible silicon photodiode for extending the sensitivity range toward shorter wavelengths. Restriction of doping of impurity only near the surface may extend the sensitivity region toward blue rays.

The other candidate for the HD-DVD reading-out element is an entirely new photodetector employing a new material as a sensing layer. Since short wavelength light is an object, the material of the sensing layer should have a wide bandgap energy. In general, a pn-photodiode or a pin-photodiode has the maximum sensitivity for the light having the energy which is equal to the bandgap of the sensing layers of the photodiode.

The HD-DVD would employ GaN-type (i.e., $In_xGa_{1-x}N$/sapphire) LDs which produce blue, green or violet rays in accordance with mixture ratio x of In as a light source. Thus, a photodiode made of GaN may be the first candidate for the HD-DVD reading-out photodetector. A pair of a GaN-LD and a GaN-PD may be attractive for a pair of a light source and a detector for the HD-DVD. In the case, the GaN photodiode may be made upon a sapphire substrate like prevalent GaN-LDs, since a defectionless large single crystal GaN substrate cannot be obtained yet. A GaN/sapphire photodiode has been neither produced nor sold on the market. The reason is that GaN layers heteroepitaxially grown on a sapphire substrate has plenty of dislocations and other defects, and the defects induce large dark current and the defects decrease the sensitivity for a 400 nm wavelength.

Indeed, GaN/sapphire is an excellent blue LD. But, a GaN/sapphire would be a bad photodiode for blue-rays, even if the photodiode were to be fabricated.

The GaN/sapphire photodiodes are inoperative as a blue-violet photodiode for a 400 nm wavelength band due to the dark current and the low sensitivity.

One purpose of the present invention is to provide a pin-photodiode which can be used for reading out HD-DVD data by sensing light of a 405 nm wavelength.

Another purpose is to provide a pin-photodiode which senses blue-violet-near-ultraviolet rays has small dark current and is highly reliable as a photodetector.

There is no avalanche photodiode which senses blue-violet-near-ultraviolet rays of 460 nm to 300 nm yet. A further purpose of the present invention is to provide a blue-ultraviolet avalanche photodiode which can detect light of wavelengths from 300 nm to 460 nm.

Gallium nitride (GaN) and indium gallium nitride (InGaN) are very influential materials of blue-green light emitting diodes (LEDs) and laser diodes (LDs), because the bandgaps of GaN and InGaN correspond to blue-violet-ultraviolet. InGaN-LEDs have been already on the market and have been used in various fields. The prevailing InGaN-LEDs are all made upon a sapphire ($Al_2O_3$) substrate. However, InGaN/sapphire is not a suitable material for photodetectors of blue or violet rays. InGaN/sapphire has plenty of defects due to the misfit between the sapphire substrate and the InGaN films. An avalanche photodiode requires a strong electric field for inducing avalanche amplification. If an APD were made by the on-sapphire InGaN, large defect density of the on-sapphire InGaN would break the APD soon. Thus, InGaN is not a candidate for making violet-ultraviolet avalanche photodiodes.

SUMMARY OF THE INVENTION

The present invention proposes a $Zn_{1-x}Mg_xS_ySe_{1-y}$ pin-photodiode having an n-type ZnSe single crystal substrate, an n-type $Zn_{1-x}Mg_xS_ySe_{1-y}$ layer epitaxially grown on directly on the n-type ZnSe substrate or via an n-type ZnSe buffer layer on the n-type ZnSe substrate, an i-type $Zn_{1-x}Mg_xS_ySe_{1-y}$ layer epitaxially grown upon the n-type $Zn_{1-x}Mg_xS_ySe_{1-y}$ layer, a p-type $Zn_{1-x}Mg_xS_ySe_{1-y}$ layer epitaxially grown on the i-type $Zn_{1-x}Mg_xS_ySe_{1-y}$ layer, a p-type $(ZnTe/ZnSe)^m$ superlattice electrode epitaxially grown on the p-type $Zn_{1-x}Mg_xS_ySe_{1-y}$ layer, a p-type ZnTe contact layer epitaxially grown upon the p-type superlattice electrode, a metallic p-type electrode formed upon the p-type ZnTe contact layer, and a metallic n-type electrode formed on the bottom of the n-type ZnSe substrate.

When the PD is a top incidence type, the metallic p-electrode should be either a small dot or an annular ring not to shield incidence light. Other parts on the top surface except the p-electrode should be coated with a protection film or an antireflection film.

A mixture crystal $Zn_{1-x}Mg_xS_ySe_{1-y}$ has two parameters x and y. When x=0, $Zn_{1-x}Mg_xS_ySe_{1-y}$ is reduced to $ZnS_ySe_{1-y}$. When y=0, $Zn_{1-x}Mg_xS_ySe_{1-y}$ is reduced to $Zn_{1-x}Mg_xSe$. When x=0 and y=0, $Zn_{1-x}Mg_xS_ySe_{1-y}$ is reduced to ZnSe. Thus, $Zn_{1-x}Mg_xS_ySe_{1-y}$ is a collective concept including ZnSe, ZnMgSe, and ZnSSe.

The photodiode has a pin-structure consisting of a p-$Zn_{1-x}Mg_xS_ySe_{1-y}$ layer, an i-$Zn_{1-x}Mg_xS_ySe_{1-y}$ layer and an n-$Zn_{1-x}Mg_xS_ySe_{1-y}$ layer. The i-$Zn_{1-x}Mg_xS_ySe_{1-y}$ layer is a light sensing layer which absorbs light and makes pairs of holes and electrons. In the case of a top-incidence type PD, incidence light arrives via the upper p-layer at the i-layer. If the p-layer absorbs the light, photocurrent is reduced. Thus, absorption of the light in the p-layer reduces sensitivity of the PD. The p-layer absorption can be reduced by thinning the p-layer or enhancing a bandgap of the p-layer. An increment of x or y raises the bandgap of $Zn_{1-x}Mg_xS_ySe_{1-y}$.

Eg(p), Eg(i) and Eg(n) denote the bandgaps of the p-, i- and n-layers. There are two alternatives for the choice of materials for the p-, i- and n-layers.

One is an equivalent bandgap case. The other is a different bandgap case.

(1) An equivalent case (Eg(p)=Eg(i)=Eg(n))

In this case, all the p-, i-, and n-layers can be ZnSe. Otherwise, all the p-, i-, and n-layers can be $ZnS_ySe_{1-y}$ or $Zn_{1-x}Mg_xSe$. Or all the layers can be $Zn_{1-x}Mg_xS_ySe_{1-y}$ having the same x and y.

(2) A different bandgap case (Eg(p)>Eg(i)=Eg(n))

This case widens a bandgap of only the p-layer. The i-layer and the n-layer should have the same bandgaps smaller than the p-layer. The p-layer acts as a transparent window. The absorption loss at the p-layer is alleviated. One candidate set is a ZnSSe p-layer and ZnSe n- and i-layers. Another candidate is a ZnMgSSe p-layer and ZnSSe n- and i-layers. A further candidate is a ZnMgSSe p-layer with higher x and y and ZnMgSSe n- and i-layers with lower x and y.

Acquisition of sufficient sensitivity for near-ultraviolet (300 nm) rays requires the p-,i- and n-layers of $Zn_{1-x}Mg_xS_ySe_{1-y}$ of x>0.1 and y>0.1. The $Zn_{1-x}Mg_xS_ySe_{1-y}$ photodiode of x>0.1 and y>0.1 would have more than 50% quantum efficiency for 300 nm near-ultraviolet rays.

It is difficult for ZnSe-type photodiodes to form an ohmic contacting p-type electrode due to the wide bandgap of ZnSe. Wide bandgap materials suffer from a common difficulty of making an ohmic contact p-electrode. ZnTe which has a narrower bandgap than ZnSe is a unique material which can be easily converted into p-type conduction and can make an ohmic contact p-electrode.

ZnTe can be doped with As, P, Li or N as a p-type dopant in a wide range of dopant concentration. The p-type ZnTe can make an ohmic contact of a low resistance with a metallic p-electrode. Any 2-6 group compound semiconductors other than ZnTe do not have such a convenient property.

Thus, instead of p-ZnSe, p-ZnTe is chosen as a p-contacting layer with a p-metallic electrode. A p-ZnTe layer can make an ohmic p-contact with the metallic electrode. A choice of p-ZnTe as a p-electrode material induces a new problem. The top layer of the p-type layers is ZnTe. But, the intermediate p-layer is ZnSe, ZnSSe or ZnMgSSe which have wide bandgaps different from ZnTe. If ZnTe is directly piled upon the p-layer of ZnSe, ZnSSe or ZnMgSSe, the difference of the bandgaps will forbid current from flowing cross the boundary between ZnTe and ZnSe and so forth.

In order to conquer the discontinuity of the bandgaps, very thin p-ZnSe films and very thin p-ZnTe films are reciprocally piled in turn. The thickness of the p-ZnTe films is larger than p-ZnSe in the vicinity of the p-ZnTe top layer. The thickness of the p-ZnTe films should be decreased toward the p-ZnSe layer. This $(ZnTe/ZnSe)^m$ layered structure is called a superlattice electrode (SLE).

An antireflection film is a transparent film which suppresses reflection of incidence light at a surface for enhancing sensitivity of a photodiode. The reflection of an antireflection film has a wavelength dependence. One wavelength gives one antireflection film. There is no common antireflection film which would be applicable to all wavelengths in a wide wavelength range. The antireflection film fills another role of protecting a p-layer from degenerating.

Determination of one wavelength of object incidence light enables an operator to design an antireflection film suitable for the object wavelength. An antireflection film is made of a pile of transparent materials for the wavelength range, for example, $Al_2O_3$, $SiO_2$, $HfO_2$, $TiO_2$, $Ta_2O_5$ or other dielectric materials. A sophisticated antireflection film can be produced by plenty of dielectric layers piled in series. A single dielectric layer having an effective quarter thickness ($\lambda/4n$) of the wavelength can be a simple antireflection film.

Further, the present invention also proposes a $Zn_{1-x}Mg_xS_ySe_{1-y}$ avalanche photodiode including an n-type ZnSe single crystal substrate, a low doped n-type $Zn_{1-x}Mg_xS_ySe_{1-y}$ ($0 \leq x \leq 0.8; 0 \leq y \leq 0.8$) avalanche layer epitaxially grown either directly upon the n-type ZnSe substrate or via an n-type ZnSe buffer layer piled upon the n-type ZnSe substrate, a p-type $Zn_{1-x}Mg_xS_ySe_{1-y}$ ($0 \leq x \leq 0.8; 0 \leq y \leq 0.8$) layer having a bandgap equal to or wider than a bandgap of the low doped n-type $Zn_{1-x}Mg_xS_ySe_{1-y}$ layer, a p-type $(ZnTe/ZnSe)^m$ superlattice electrode which is made by piling p-type ZnTe thin films and p-type ZnSe thin films reciprocally, a p-type ZnTe contact layer epitaxially grown on the p-type superlattice electrode, a metallic p-type electrode formed upon the p-type ZnTe contact layer, a metallic n-type electrode formed on the bottom of the n-ZnSe substrate, and sides of all the epitaxially piled layers except the n-type ZnSe substrate being etched into a mesa, the etched sides being coated with an insulating film. The structure of p- and n-type metallic electrodes is the same as the before mentioned pin-PD electrodes.

The p-electrode on the top surface should be a small dot or a ring in order to introduce incidence light into the layered structure. The top surface except the p-electrode should be covered with a dielectric protection film or an antireflection film.

For simplicity, mixture ratios x and y are sometimes omitted in this description. ZnMgSSe is an abbreviation of $Zn_{1-x}Mg_xS_ySe_{1-y}$ which includes x and y. When x=0, $Zn_{1-x}Mg_xS_ySe_{1-y}$ is reduced to $ZnS_ySe_{1-y}$. When x=0 and y=0, $Zn_{1-x}Mg_xS_ySe_{1-y}$ is reduced to ZnSe. Thus, ZnMgSSe includes ZnSSe and ZnSe also.

This invention pairs the p-ZnMgSSe layer with the n-ZnMgSSe layer in order to detect violet-ultraviolet rays and makes a pn-junction between the p-ZnMgSSe layer and the n-ZnMgSSe layer. When a reverse bias is applied, depletion layers (i-layer) are bilaterally generated from the pn-junction to both the p-ZnMgSSe layer and the n-ZnMgSSe layer by the reverse bias. The depletion layer which has poor carriers is an intrinsic semiconductor. The depletion layer is sometimes called an "i-layer". Thus, the structure is named a "pin" structure.

Incidence light arrives via the p-layer at the pn-junction. If a bandgap of the n-layer is equal to a bandgap of the p-layer, a part of the incidence light is absorbed in the upper p-layer before reaching the pn-junction. The absorption in the p-layer is a loss. Since the p-layer is thin, the absorption loss is small. When the absorption loss in the upper p-layer should be fully avoided, the p-layer should be composed of a material having a wider bandgap than the n-layer. The bandgap of the p-layer is denoted by Eg(p). The bandgap of the n-layer is denoted by Eg(n). There are two allowable cases.

(1) An equivalent case (Eg(p)=Eg(n))

A material of the p-layer is the same as a material of the n-layer. This equivalent case allows the p-layer to absorb a part of the incidence light. For example, the p- and n-layers are made of ZnSe. Otherwise, the p- and n-layers are composed of $ZnS_ySe_{1-y}$ of the same y. Or in general, the p- and the n-layers have a component of $Zn_{1-x}Mg_xS_ySe_{1-y}$ with common ratios x and y.

(2) An inequivalent case (Eg(p)>Eg(n))

A material of the p-layer has a bigger bandgap energy than a material of the n-layer. The inequivalent case forbids the p-layer from absorbing the incidence light. The sensitivity is raised by avoiding the p-layer absorption loss. For example, the n-layer is ZnSe and the p-layer is ZnSSe or ZnMgSSe. Other example has an n-ZnSSe layer and a p-ZnMgSSe layer. Another example has a n-ZnMgSSe layer and a p-ZnMgSSe which has a bigger bandgap than the n-ZnMgSSe layer.

The present invention gives a ZnMgSSe pin-photodiode having an n-ZnSe substrate, an n-ZnMgSSe layer, an i-ZnMgSSe depletion layer, a p-ZnMgSSe layer, and a p-(ZnTe/ZnSe)$^m$ superlattice electrode for detecting blue-ultraviolet rays for the first time. An Si pin-photodiode which is suitable for visible and near-infrared rays has poor sensitivity for the blue-violet rays. A GaN/sapphire pin-photodiode has no sensitivity for blue-violet rays and poor sensitivity for ultraviolet rays. Beside the poor sensitivity, large dark current deprives the GaN/sapphire photodiode of practical value as a ultraviolet PD.

This invention gives a highly operative photodiode for blue-near-ultraviolet rays. The employment of the ZnSe substrate and the homoepitaxy of the pin-layers on the ZnSe substrate enable the ZnMgSSe-PD to enhance the sensitivity and the reliability by decreasing dark current and degradation.

The present invention also proposes a blue-ultraviolet avalanche photodiode with a long lifetime, high reliability and high sensitivity for the first time. The avalanche photodiode of the present invention has an n-ZnSe substrate, an n-ZnMgSSe mixture layer on the n-ZnSe substrate, a p-ZnMgSSe mixture layer on the n-ZnMgSSe layer, a p-(ZnTe/ZnSe)$^m$ superlattice electrode, and a p-ZnTe contact layer. A wide bandgap of ZnMgSSe enables the avalanche photodiode to sense blue, violet and near-ultraviolet rays. At present, available avalanche photodiodes are only a Si-APD and a Ge-APD. The Si-APD has sensitivity for visible light. The Ge-APD has sensitivity for infrared rays. There have never been a blue-ultraviolet sensitive APD. This invention proposes a blue-ultraviolet APD making use of ZnMgSSe with a wide bandgap. Unlike silicon, ZnMgSSe is suffering from a difficulty of making a p-type crystal, a difficulty of making a pn-junction, a difficulty of making a metallic p-electrode and a difficulty of making a good ZnSe single crystal substrate. Thus, the layered structure of the ZnMgSSe-APD is entirely different from the conventional Si-APD which has a p-Si substrate, pn-junctions made by thermally diffusing n-dopants or p-dopants, and guardrings. Furthermore, the upper sides of the APD chip of the present invention are etched and are coated with protecting, insulating layers. The ends of the pn-junction are protected by the protecting layers, which ensures a long lifetime.

A breakdown voltage of the APD depends upon the dopant concentration of the n-layer and the p-layer. Embodiment 4 gives a −27 V breakdown voltage. A −25 V reverse bias amplifies the gain fifty-times as strong as a 0 V bias.

There is only a photomultiplier as a photodetector which has high sensitivity for short wavelength (blue-violet-ultraviolet) light. The photomultiplier is a bulky, heavy, expensive, ill-operative, fragile photodetector which requires a heavy, large power source and a light shield for prohibiting external noise light from breaking a phototube.

The present invention is the first light, inexpensive, good-operative, sturdy blue-ultraviolet sensitive semiconductor photodetector. Gallium nitride (GaN) seems to be a strong candidate for ultraviolet photodetectors due to a wide bandgap. However, since GaN films are heteroepitaxially made on a sapphire substrate, the GaN films are suffering from plenty of defects which will be rapidly grown and will break a pn-junction by application of strong reverse bias. GaN is unsuitable for a material of avalanche photodiodes. The ZnMgSSe-APD is an epochmaking, unique APD operative for the short wavelength range of blue, violet and near-ultraviolet rays.

BRIEF DESCRIPTION OF THE DRAWINGS

FIG. 6 is a sectional view of a chemical vapor transport (CVT) apparatus which produces a ZnSe single crystal from a ZnSe polycrystal by transporting Zn by iodine (I).

FIG. 20 is a sub-layered structure of the (ZnTe/ZnSe)$^m$ superlattice electrode.

DETAILED DESCRIPTION OF THE PREFERRED EMBODIMENTS

[Layered Structure of a ZnSe Pin-Type Photodiode of the Present Invention]

A pin-photodiode of the present invention has a layered structure including an n-electrode, an n-ZnSe substrate, an n-ZnSe buffer layer, an n-type layer, an i-type layer, a p-type layer, a p-type superlattice electrode, a p-ZnTe layer and a p-electrode from the bottom to the top. The intermediate n-type layer, i-type layer and p-type layer are made of ZnSe, ZnSSe, ZnMgSe, or ZnMgSSe. Allowable crystal structures are now listed from the bottom to the top.

1. n-electrode Au—In, In, Au/Ti
2. substrate n-ZnSe
3. buffer layer n-ZnSe
4. n-type layer n-ZnSe, n-ZnSSe, n-ZnMgSe, n-ZnMgSSe
5. i-type layer i-ZnSe, i-ZnSSe, i-ZnMgSe, i-ZnMgSSe
6. p-type layer p-ZnSe, p-ZnSSe, p-ZnMgSe, p-ZnMgSSe
7. superlattice electrode p-(ZnTe/ZnSe)$^m$
8. contacting layer p-ZnTe
9. antireflection film Al$_2$O$_3$, SiO$_2$, HfO$_2$, Ta$_2$O$_5$, SiN, TiO$_2$, or a set of them
10. p-electrode Au-Pd-Pt, Au-Pt, Au Carrier concentrations of the layers are described. The non-doped i-layer has the smallest carrier concentration equal to or less than 10$^{16}$ cm$^{-3}$ (n≦10$^{16}$ cm$^{-3}$). The p-contacting layer has the highest carrier concentration of p=10$^{19}$ cm$^{-3}$~5×10$^{19}$ cm$^{-3}$ for reducing resistance of an ohmic contact with the p-electrode. Other p-layer, i-layer and n-layer should have the medium carrier concentration of 10$^{17}$ cm$^{-3}$ to 10$^{19}$ cm$^{-3}$. A p-type dopant for ZnSe, ZnTe, ZnSSe or ZnMgSSe is nitrogen (N). An n-dopant for ZnSe, ZnSSe or ZnMgSSe is chlorine (Cl).

[Probability of ZnSe as a material of photodiodes]

ZnSe has a bandgap wavelength (absorption edge wavelength) of 460 nm. ZnSe has a power of absorbing blue-violet rays of 400 nm wavelength with high absorption efficiency. Thus, ZnSe is a promising material for blue-violet photodiodes.

[Bandgap and lattice constant of mixture crystal ZnMgSSe]

Figure 1:
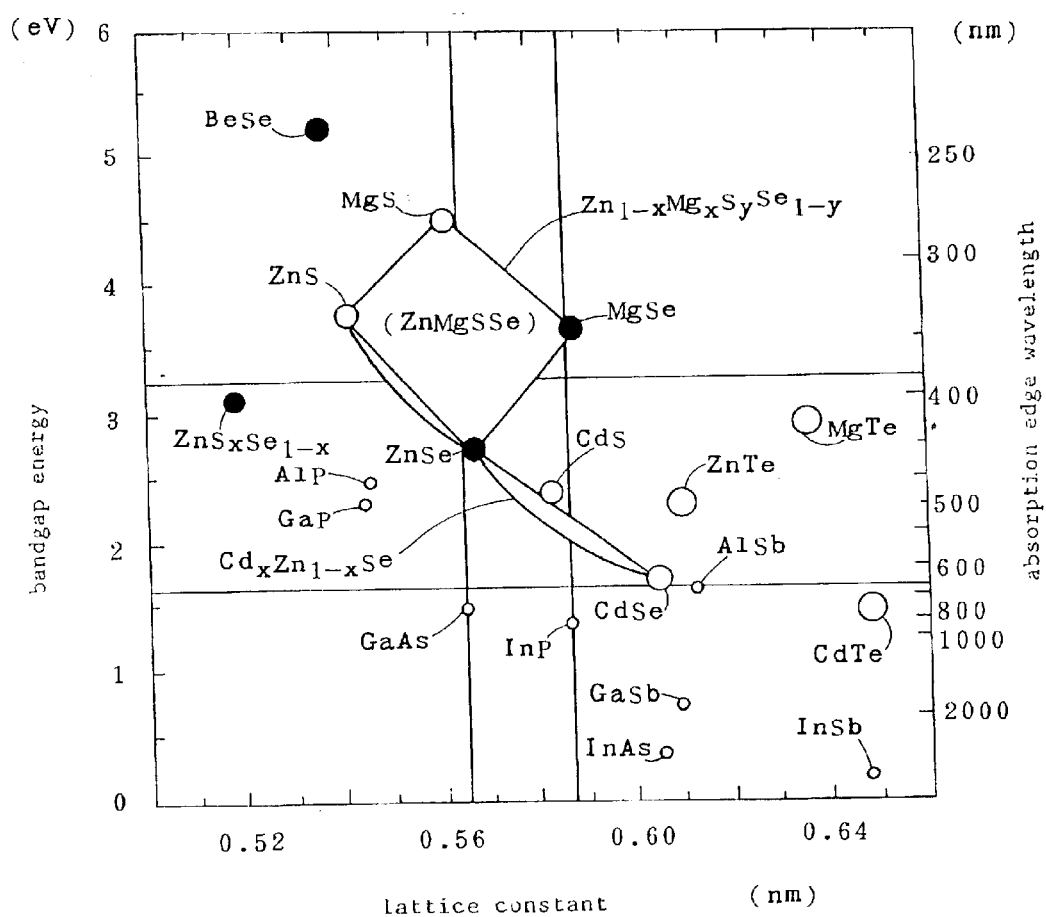
FIG. 1 is a diagram of ZnMgSSe mixture crystals showing lattice constants and bandgaps (wavelengths) of dotted components.

FIG. 1 shows lattice constants and bandgap energy of various materials including ZnMgSSe. The abscissa is a lattice constant (nm). The left ordinate is a bandgap energy (eV). The right ordinate is a bandgap wavelength (absorption edge wavelength) (nm). The left and right ordinates denote the equal energy. ZnSe, ZnS, MgS and MgSe make a lozenge at a center of the diagram. ZnSe (zinc selenide) has a 2.68 eV (460 nm) bandgap and a 0.5668 nm lattice constant. A vertical line is drawn in the figure for showing the 0.56 nm lattice constant which is the lattice constant of gallium arsenide (GaAs). A line drawn from ZnSe to MgSe is a rightward rising line which shows a mixture $Zn_{1-x}Mg_xSe$ The transition from ZnSe to MgSe increases both the lattice constant and the bandgap. MgS has the highest bandgap of about 4.5 eV (absorption edge wavelength; 270 nm) among the four. MgS has a lattice constant similar to that of GaAs.

Another line drawn from ZnSe to ZnS is a leftward rising line which shows another mixture $ZnS_ySe_{1-y}$. The transition from ZnSe to ZnS increases the bandgap but decreases the lattice constant. The contradictory tendency of the lattice constant between ZnSe-ZnS transition and ZnSe-MgSe transition enables the four crystals to form a wide lozenge in the lattice constant-bandgap diagram. The existence of the wide lozenge results in high degree of freedom of designing mixture crystals. The ZnSe-ZnS transition is not linear. ZnS has an absorption edge wavelength of 340 nm (3.6 eV). A line connecting ZnS to MgS denotes another mixture ZnMgS.

MgS has the largest bandgap of 4.5 eV and a lattice constant of 0.54 which is similar to ZnSe. Another line from MgSe to MgS denotes another mixture MgSSe. The four sides indicate quadruple mixture crystals. Any points in the inner region of the lozenge mean quadruple mixture $Zn_{1-x}Mg_xS_ySe_{1-y}$ crystals having two parameters.

The mixture crystal is often written as "ZnMgSSe" in this description by omitting the parameters x and y in brief.

FIG. 1 shows a point for GaAs below the lozenge. The lattice constants of MgS and ZnSe are close to that of GaAs of 0.56 nm. Thus, the quadruple mixture $Zn_{1-x}Mg_xS_ySe_{1-y}$ crystals have a possibility of changing the bandgap energy from 2.5 eV to 4.5 eV, satisfying the lattice fitting condition on a GaAs substrate.

Properties of the quadruple mixture $Zn_{1-x}Mg_xS_ySe_{1-y}$ crystals are considered. Magnesium (Mg) and zinc (Zn) are group two elements on the periodic table. An increase of a Mg rate x has a tendency of heightening a bandgap and increasing a lattice constant. An increase of a Zn rate (1-x) has a reverse tendency of reducing the bandgap and the lattice constant. The outermost electrons of Mg are 3s electrons. The outermost electrons of Zn are 3d electrons. A bandgap is a energy difference between a conduction band bottom and a valence band top.

The valence bands are formed by superposing the outermost electron orbits, an s-orbit, a d-orbit and a p-orbit, of isolated atoms. The conduction bands are formed by superposing the level just higher than the outermost electron orbits of the isolated atoms. The forbidden band (bandgap) is determined by the orbit energy of the isolated atoms. Thus, group two elements having a lower order (s-orbit, p-orbits) outermost orbit have wider bandgaps than other group two elements having a higher order (d-orbits) outermost orbit. Then, Mg has a wider bandgap than Zn.

A similar relation of bandgaps is valid also for group six elements (S and Se). The outermost orbit of an isolated sulfur (S) atom is a 3p-orbit. The outermost orbit of an isolated selenium (Se) atom is a 4p-orbit. A higher order orbital has a smaller bandgap. Thus, ZnSe has a narrower bandgap than ZnS. In general, a light atom has a tendency of having a wider bandgap than a heavy atom. The tendency is common both to group two and group six elements.

However, the determination of lattice constants is reverse to group two elements and group six elements. ZnSe has a bigger lattice constant than ZnS. ZnSe and ZnS have partially ionic bonds. A minus ion Se⁻ is larger than another minus ion S⁻. On the contrary, the group two elements have reverse tendency. Mg has a bigger radius than Zn. Thus, a lattice constant of MgS is bigger than that of ZnS. MgSe is larger than ZnSe in lattice constant.

The contradictory tendency of the lattice constant and the bandgap between the group two elements and the group six element gives various mixture crystals having wide ranges of bandgaps and lattice constants. Four binary components of MgSe, ZnSe, ZnS and MgS form a wide lozenge in the lattice constant-bandgap binary coordinates as shown in FIG. 1. Even if the lattice constant is predetermined, bandgaps can take various values.

In FIG. 1, vertical lines are drawn for showing the lattice constants of GaAs and InP. GaAs and InP allow makers to produce large bulk single crystals with good quality. No large good single crystal could be made of other materials except GaAs and InP in FIG. 1. InP cannot be a substrate crystal for the lozenge mixtures. Fortunately, the GaAs lattice line (vertical line) crosses the quadruple lozenge. Thus, there is a possibility of making use of a GaAs single crystal as a substrate for growing the quadruple $Zn_{1-x}Mg_xS_ySe_{1-y}$ crystals. The lattice fitting condition consumes one freedom of the parameters x and y. But, one degree of freedom remains. Since a good ZnSe single crystal had not been produced, a GaAs crystal was often used to be a substrate for producing ZnSe-type devices.

Since the GaAs lattice line (vertical line) crosses the lozenge nearly from ZnSe to MgS, a GaAs substrate would allow $Zn_{1-x}Mg_xS_ySe_{1-y}$ to produce mixture films of a bandgap between 2.6 eV and 4.5 eV.

A further higher bandgap is obtained by including BeSe which lies at a left upper spot in FIG. 1. Quadruple mixture ZnBeSSe and ZnBeMgSe will realize a higher bandgap crystal for detecting ultraviolet rays.

On the contrary, a lower bandgap is realized by another quadruple mixture ZnCdBeSe crystal which is located at a lower spot in FIG. 1.

Someone has investigated ZnSe photodiodes by making ZnSe layers heteroepitaxially piled upon a GaAs substrate. However, the on-GaAs ZnSe layers are suffering from plenty of defects induced by the misfitting between ZnSe and GaAs. Ideally, a ZnSe bulk single crystal is desirable for the substrate of growing ZnSe layers homoepitaxially. However, no ZnSe photodiode has been made upon ZnSe substrates.

The largest reason why nobody has made a ZnSe/ZnSe photodiode is that no large bulk ZnSe single crystal substrate of good quality can be made till recently. Another reason is that there has been poor demand for blue-violet light photodiodes.

Silicon (Si) photodiodes are uniquely used for detecting visible light. Germanium (Ge) photodiodes are used for detecting near-infrared rays. There has been no pertinent light sources of blue-violet rays. Thus, there has been no need for blue-violet light photodetectors. The skilled seem to believe still in Si-photodiodes for detecting blue-violet rays. Thus, few persons are aware of ZnSe as a material of photodiodes for blue-violet rays.

Production of a ZnSe bulk large single crystal has been impossible until recently. Thus, a on-ZnSe PD had been an unrealized dream for a long time. But, longterm effort and trial enable the applicant to make a large ZnSe bulk single crystal by a CVT method which is explained later in the description.

The presence of a large high-quality ZnSe single crystal substrate allows us to produce ZnSe films or mixture crystal films including ZnSe on the ZnSe substrate by molecular beam epitaxy (MBE). One purpose of the present invention is to provide an on-ZnSe/ZnMgSSe pin-photodiode and an on-ZnSe/ZnMgSSe avalanche photodiode for detecting blue, violet and near-ultraviolet rays. Another purpose of the invention is to provide a ZnMgSSe pin-photodiode and a ZnMgSSe avalanche photodiode for detecting 405 nm light for the HD-DVD without dark current.

A ZnMgSSe pin-type PD of the present invention includes an n-type ZnSe single crystal substrate, a pin layered structure consisting of a p-layer, an i-layer and an n-layer which are made of $Zn_{1-x}Mg_xS_ySe_{1-y}$ (x=0-0.8, y=0-0.8), $Zn_{1-x}Be_xSe_{1-y}Te_y$ (x=0-1, y=0-1) or $Zn_{1-x-y}Be_xMg_ySe$ (x=0-0.2, y=0-0.2), a window layer of $Zn_{1-x}Mg_xS_ySe_{1-y}$ (x=0-0.8, y=0-0.8), $Zn_{1-x}Be_xSe_{1-y}Te_y$ (x=0-1, y=0-1) or $Zn_{1-x-y}Be_xMg_ySe$ (x=0-0.2, y=0-0.2), a $(ZnTe/ZnSe)^m$ superlattice electrode (SLE) grown on the p-layer, a p-electrode on the SLE and an n-electrode on the bottom of the n-ZnSe substrate. Optionally, an antireflection film is formed on the top p-layer.

The heteroepitaxial structure made on the n-ZnSe substrate has a pin three-layered structure. The three p-, i- and n-layers of a pin junction have $Zn_{1-x}Mg_xS_ySe_{1-y}$ (x=0-0.8, y=0-0.8), $Zn_{1-x}Be_xSe_{1-y}Te_y$ (x=0-1, y=0-1) or $Zn_{1-x-y}Be_xMg_ySe$ (x=0-0.2, y=0-0.2). Mixture parameters x and y are independent parameters inherent to the individual layers. Thus, in the case of $Zn_{1-x}Mg_xS_ySe_{1-y}$ (x=0-0.8, y=0-0.8), the PD of the present invention is defined by six parameters xn, yn for the n-layer, xi and yi for the i-layer and xp and yp for the p-layer. Otherwise, in the case of $Zn_{1-x}Be_xSe_{1-y}Te_y$ (x=0-1, y=0-1), the PD of the present invention is also defined by six parameters xn, yn for the n-layer, xi and yi for the i-layer and xp and yp for the p-layer. Further, in the case of $Zn_{1-x}Be_xMg_ySe$ (x=0-0.2, y=0-0.2), the PD of the present invention is also defined by six parameters xn, yn for the n-layer, xi and yi for the i-layer and xp and yp for the p-layer.

A general layer structure of a $Zn_{1-x}Mg_xS_ySe_{1-y}$ type PD of the present invention is described from the top to the bottom as, p-electrode (metal, ring or dot)+aperture or antireflection film
p-$(ZnTe/ZnSe)^m$ superlattice electrode
p-$Zn_{1-x}Mg_xS_ySe_{1-y}$ (x=0-0.8, y=0-0.8)
i-$Zn_{1-x}Mg_xS_ySe_{1-y}$ (x=0-0.8, y=0-0.8)
n-$Zn_{1-x}Mg_xS_ySe_{1-y}$ (x=0-0.8, y=0-0.8)
n-buffer layer (omittable)
n-ZnSe substrate
n-electrode (metal).

Alternately another general layer structure of a $Zn_{1-x}Be_xSe_{1-y}Te_y$ (x=0-1, y=0-1) PD is described from the top to the bottom as, p-electrode (metal, ring or dot)+aperture or antireflection film
p-$(ZnTe/ZnSe)^m$ superlattice electrode
p-$Zn_{1-x}Be_xSe_{1-y}Te_y$ (x=0-1, y=0-1)
i-$Zn_{1-x}Be_xSe_{1-y}Te_y$ (x=0-1, y=0-1)
n-$Zn_{1-x}Be_xSe_{1-y}Te_y$ (x=0-1, y=0-1)
n-buffer layer (omittable)
n-ZnSe substrate
n-electrode (metal).

Alternately further general layer structure of a $Zn_{1-x-y}Be_xMg_ySe$ (x=0-0.2, y=0-0.2) PD is described from the top to the bottom as, p-electrode (metal, ring or dot)+aperture or antireflection film
p-$(ZnTe/ZnSe)^m$ superlattice electrode
p-$Zn_{1-x-y}Be_xMg_ySe$ (x=0-0.2, y=0-0.2)
i-$Zn_{1-x-y}Be_xMg_ySe$ (x=0-0.2, y=0-0.2)
n-$Zn_{1-x-y}Be_xMg_ySe$ (x=0-0.2, y=0-0.2)
n-buffer layer (omittable)
n-ZnSe substrate
n-electrode (metal).

In any cases, the homoepitaxial structure grown on the ZnSe substrate has a three layered nip-structure. In the photodiode of the present invention, a p-region is made not by thermal diffusion but by epitaxial growth. N-layers are made by doping Cl as an n-dopant. P-layers are produced by doping N as a p-dopant by a radical cell in an MBE apparatus.

The top layer of the three-layered pin structure is a ZnSe layer. But, no p-metallic electrode can be ohmically made directly upon the ZnSe layer. The ZnSe layer prohibits the p-metal electrode from becoming an ohmic contact with the ZnSe layer in any cases.

Only ZnTe enables the metallic p-electrode to make an ohmic contact with the ZnTe layer. However, the bandgap of ZnTe is different from ZnSe. If a thick p-ZnTe layer is made upon a p-ZnSe, the big difference of the band gaps impedes current flow from the upper p-ZnTe to the lower p-ZnSe. Thus, a superlattice electrode (SLE) of a plurality of reciprocal piles of (ZnTe/ZnSe) is made upon the top p-ZnMgSSe layer for alleviating the difference of the bandgaps. Then, the metallic p-electrode is ohmically made on the top ZnTe of the superlattice electrode $(ZnTe/ZnSe)^m$.

More in detail, ZnSe has a 2.6 eV bandgap. ZnTe has a 2.2 eV bandgap. The bandgap of ZnSe is bigger than that of ZnTe by 0.4 eV. The bandgap should be continually decreased from the p-window layer to the metallic p-electrode. Thus, thicknesses of the reciprocal ZnTe films and ZnSe films should be changed for varying the effective bandgap from 2.6 eV to 2.2 eV. The superlattice electrode can be designed by the requirement of the continuity of changing the bandgap.

The metallic p-electrode should be formed upon the top ZnTe contact layer. P-ZnTe can make an ohmic contact with some metal. The shape of the metallic p-electrode depends upon the direction of incidence light. In the case of a top incidence type PD, the metallic p-electrode should be a small dot or a circular ring not for disturbing the incidence of light. The light goes via an aperture within the circular ring. A bottom n-electrode can be a uniform allover electrode without an aperture. In the case of a bottom incidence type PD, the bottom n-electrode should be a circular ring not to disturb the incidence of light via the bottom.

The p-electrode should be made of Pt-Au, Pt-Pd-Au, or Au. These metallic materials can make an ohmic contact electrode with the p-ZnTe layer.

An antireflection/protection film should be formed on the p-ZnTe layer within the metallic p-electrode ring for introducing light into the p-ZnTe layer without reflection loss. The antireflection/protection film should be made of $SiO_2$, $Al_2O_3$, $HfO_2$, $TiO_2$, $Ta_2O_5$ or SiN which is transparent to the object blue-ultraviolet rays. A suitable material should be chosen in accordance with a wavelength and object of the photodiode. A simple antireflection film is a single film having a thickness of $\lambda/4n$, where $\lambda$ is an object wavelength and n is a refractive index of the film. When the PD should have flat sensitivity in a wide wavelength range, the aperture should be free from an antireflection film. Even in the case, it is still useful to provide the aperture with a transparent film for protecting the layered structure and the p-electrode.

Materials of the n-electrode made on the bottom of the n-ZnSe substrate are Au—In, In or Au/Ti.

Functions of the photodiodes are described. A reverse biasing power source applies negative voltage to the p-metallic electrode and positive voltage to the n-metallic electrode. Since the p-layers and the n-layers have sufficient conductivity, most of the bias voltage is applied to the i-layer with high resistivity.

The reverse bias generates p- and n-depletion layers in a p-layer and an n-layer at a pn-junction. The thicknesses of the depletion layers depend upon the impurity concentration and the reverse bias. In the case of a top-incidence type photodiode, blue incidence rays go via an antireflection film on the top annular opening enclosed by a ring p-electrode into the photodiode.

The blue incidence rays are slightly absorbed in the p-ZnTe owing to the narrow band gap of ZnTe. The absorption is small, since the p-ZnTe layer is thin enough. The rays are slightly absorbed in the superlattice of ZnTe/ZnSe layers.

Then, the rays arrive at a p-window layer. When the p-window layer is wider than an i-layer, the light is not absorbed in the window layer. When the p-window layer has the same band gap as the i-layer, the light is slightly absorbed in the p-window layer.

Surviving light arrives at the non-doped i-ZnSe layer (or ZnSSe or ZnMgSSe layer), the p-depletion layer and the n-depletion layer. The wavelength corresponding to the band gap (in short; band gap wavelength) of ZnSe is 460 nm. The incidence 400 nm light which has higher energy than the ZnSe band gap induces electron-hole band gap transitions in the i-ZnSe layer. Since the i-ZnSe is very thick, all incidence light is absorbed and is changed into pairs of holes and electrons. The reverse bias pulls holes to the p-layers and carries electrons to the n-layers. When an electron arrives at the n-layer and a hole arrives at the p-layer, a unit current q flows in an external circuit. Then, the photodiode yields photocurrent in proportion to the power of the incidence light.

[Wavelength Dependence]

Figure 2:
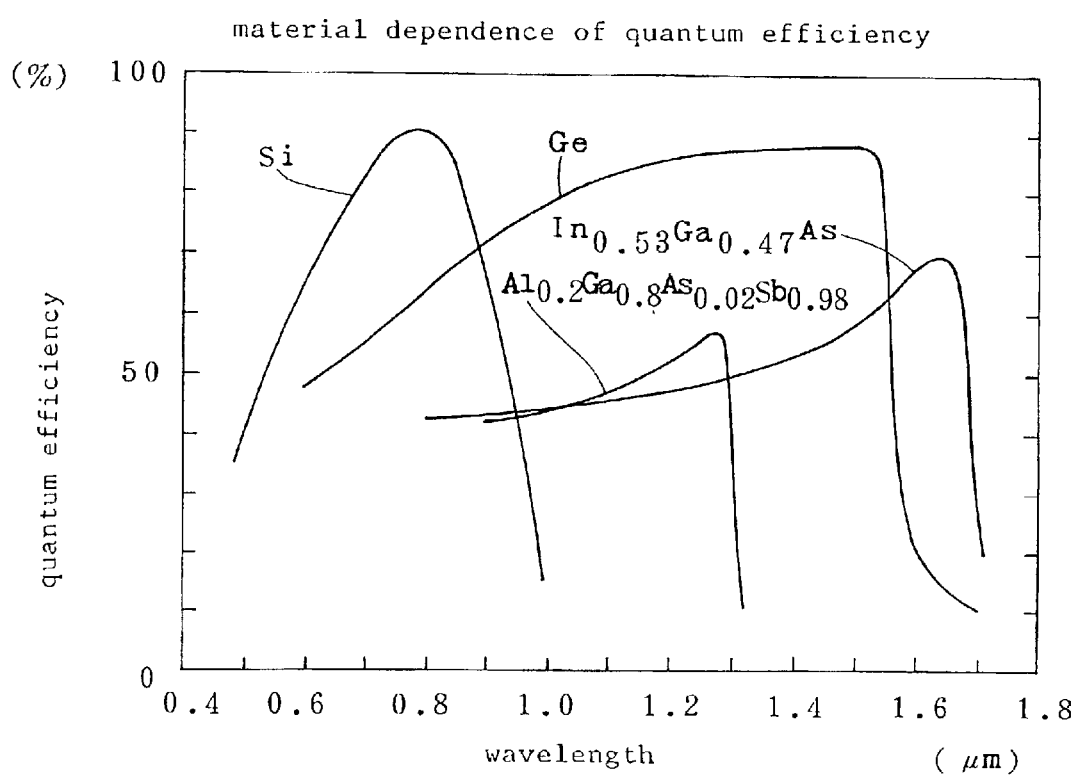
FIG. 2 is a graph showing quantum efficiency of a known Si-PD, a known Ge-PD, a known InGaAs-PD, and a known AlGaAsSb-PD in a wavelength range of visible and near-infrared light.

Theoretical quantum efficiency of conventional photodiodes is shown in FIG. 2. As before-described, prevalent Si photodiodes have high sensitivity for red-near-infrared rays between 700 nm and 800 nm. Si photodiodes are useless for 400 nm. In any kinds of photodiodes, the theoretical quantum efficiency attains a peak for the bandgap wavelength ($\lambda g=hc/Eg$; Eg bandgap) corresponding the bandgap of the sensing material. The sensitivity falls in proportion to the wavelength $\lambda$ for the light of a wavelength shorter than $\lambda g$.

[External Quantum Efficiency]

Figure 3:
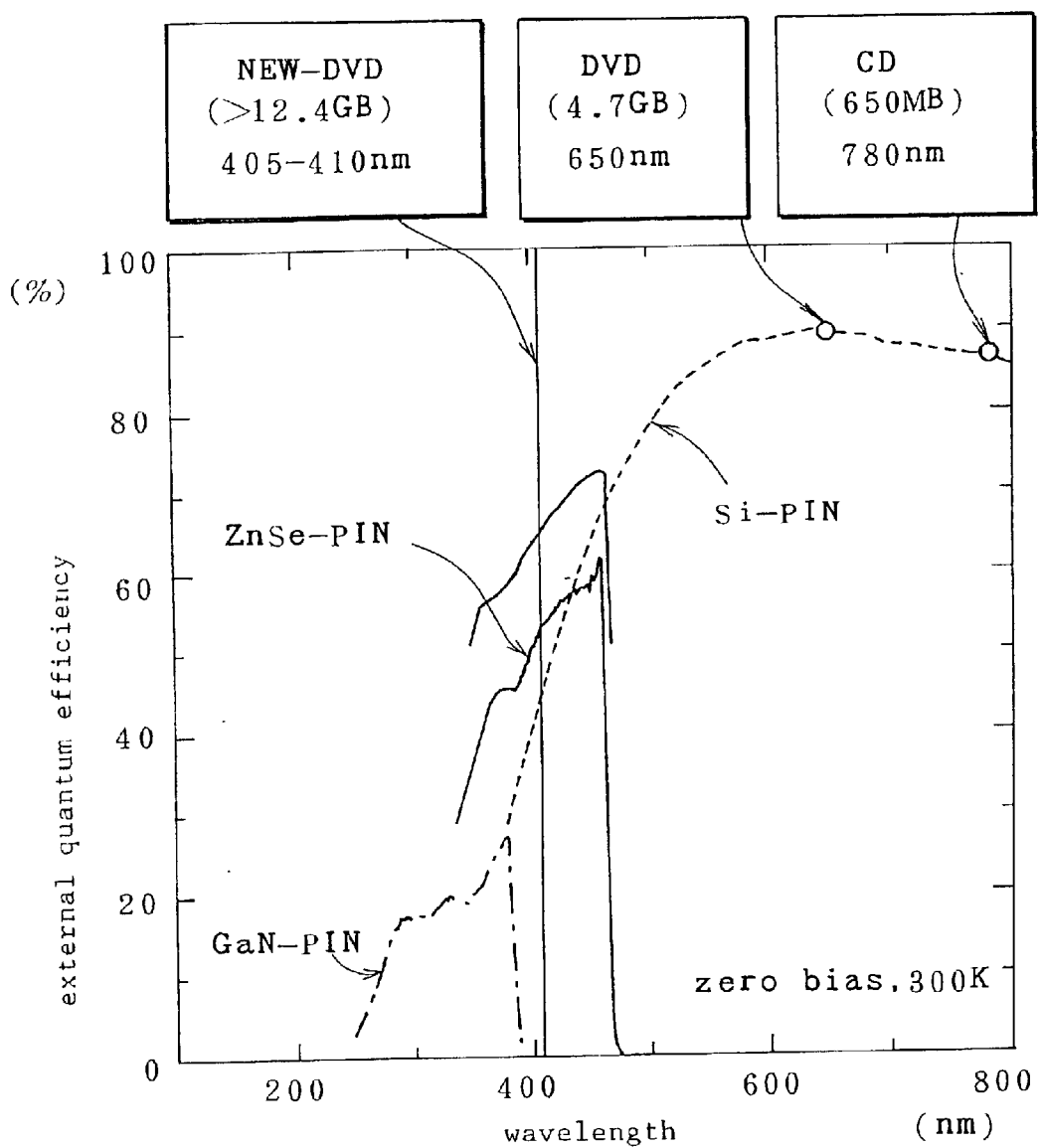
FIG. 3 is a graph showing quantum efficiency of a known Si pin-PD, a tentatively-made GaN pin-PD, and a ZnSe pin-PD of the present invention in a wavelength range of visible and near-ultraviolet light.

FIG. 3 shows a result of measurements of external quantum efficiency of various photodiodes at a short wavelength range between 200 nm and 800 nm. Prevailing Si-PDs have no sensitivity below a 400 nm wavelength (violet-ultraviolet).

Gallium nitride (GaN) is the most successful, significant wide bandgap material. Tentatively-made GaN pin-PDs show the small quantum efficiency (20%) to the wavelength range from 300 nm to 400 nm. The GaN-PD has no sensitivity at 400 nm. The quantum efficiency which is a rate of light/current conversion is a significant factor determining the sensitivity. But, the quantum efficiency is different from the sensitivity itself. The sensitivity depends also upon an aperture rate, existence of an antireflection film and reverse bias. Since the other factors reduce the sensitivity, a practical value of the sensitivity is lower than the quantum efficiency. The tentatively-made GaN-PD which is produced heteroepitaxially upon a sapphire substrate is suffering from big dark current and low quantum efficiency due to large dislocation density. The GaN-PD is entirely useless even for the violet-ultraviolet range between 300 nm and 400 nm.

The ZnSe pin-PD of the present invention enjoys high quantum efficiency of 40% to 50% for the violet-ultraviolet range between 300 nm and 470 nm. The ZnSe-PD excels in the quantum efficiency and sensitivity for blue, violet and ultraviolet rays. The inventor believes that the ZnSe pin-PD is a unique photodiode for near-ultraviolet and violet rays.

Table 2 shows bandgaps, bandgap wavelengths (absorption edge wavelengths), refractive indices, transition types and dark current for Si-PDs, ZnSe-PDs and GaN-PDs.

TABLE 2

Bandgaps, absorption edge wavelengths, refractive indices, transition types, and dark currents of an Si photodiode, a ZnSe photodiode and a GaN photodiode

| Material | Si | ZnSe | GaN |
| --- | --- | --- | --- |
| Bandgap | 1.11 eV | 2.67 eV | 3.39 eV |
| Absorption edge wavelength | 1117 nm | 464 nm | 366 nm |
| Refractive index | 3.44 | 2.61 | 2.18 |
| Transition type | indirect | direct | Direct |
| Dark current | small | small | big |

The items except the dark current are inherent properties of materials of the PDs. The values of the properties are well known. The absorption edge wavelength (bandgap wavelength) is related to the bandgap Eg by $\lambda g(nm)=hc/Eg=1239/Eg(eV)$. When the bottom of the conduction band differs from the top of the valence band in a k-space ($\Delta k \neq 0$), the transition between the conduction band and the valence band is called "indirect transition". When the bottom of the conduction band coincides with the top of the valence band in the k-space ($\Delta k=0$), the transition is called "direct transition". Si relies upon the indirect transition which is motivated by an intervention of phonons (lattice vibration). The direct transition is a requisite for light emitting devices. Thus, silicon cannot be a medium of laser diodes or light emitting diodes. However, the direct transition is not an essential condition for photodiodes.

The dark current is a current flow without irradiation. The dark current is induced by defects of a crystal structure. The big dark current in the GaN-PDs is induced by poor crystal property of GaN films grown on a sapphire substrate.

An avalanche photodiode requires very good crystal property since a pn-junction should be reversely biased slightly below the breakdown voltage for enhancing an amplifying rate. A poor crystal layered structure would be easily broken down by the application of the strong reverse bias.

Since no good ZnSe single crystal could be made, ZnSe-type devices were heteroepitaxially made upon a GaAs substrate. However, the heteroepitaxial boundary has plenty of defects which grow by the reverse bias and induce breakdown. The defects have forbidden an appearance of an on-GaAs ZnSe type avalanche photodiode. Then, no ZnSe-APD has been made till now. There is no prior art of a ZnSe-APD.

One purpose of the present invention is to propose a practical ZnSe type avalanche photodiode. Production of a ZnSe type APD requires a large good ZnSe single crystal which acts as a substrate. Difficulty of obtaining a good ZnSe single crystal is one reason why a ZnSe-APD did not exist.

Another reason is that ZnSe has attracted attention as a material of blue-light LEDs. Fabrication of the blue-light LEDs has demanded for good ZnSe single crystals. But, nobody was aware of a possibility of making a photodiode by ZnSe.

Production of a ZnSe bulk large single crystal has been impossible until recently. But, longterm effort and trial enable the applicant to make a large ZnSe bulk single crystal by a CVT method which is explained later in the description. Another effort allows the applicant to succeed in suppressing occurrence of defects at an epi-film/substrate interface in ZnSe/ZnSe type homoepitaxy.

The present invention aims at proposing a ZnSe-APD by making the best use of maturity of the basic techniques of ZnSe.

[Layered Structure of a ZnSe-Type APD of the Present Invention]

A ZnSe-type avalanche photodiode of the present invention includes an n-electrode, an n-ZnSe substrate, an n-ZnSe buffer layer, an n-ZnMgSSe light receiving layer, a p-ZnMgSSe light receiving layer, a p-SLE, a p-ZnTe contact layer, a protecting film and a p-metallic electrode, from the bottom to the top. Optionally, sides of the APD chips are etched into a mesa-shape and the sides are coated with insulating, protecting films. There are two alternatives regarding dopant concentrations between the p-ZnMgSSe layer and the n-ZnMgSSe layer. One case (n-p) is that the n-ZnMgSSe layer has a dopant concentration smaller than the p-ZnMgSSe layer. The other case (np$^-$) is that the n-ZnMgSSe layer has a dopant concentration larger than the p-ZnMgSSe layer.

(In the Case of n$^-$p)

The n-ZnMgSSe layer has carrier concentration smaller than the p-ZnMgSSe layer. Reverse bias makes a wider n-depletion layer and a narrower p-depletion layer. As explained before, the ratio of the thickness is in reverse proportion of the ratio of the impurity concentration. Almost all of incidence light is absorbed in the wider n-depletion layer. Photocurrent (electrons and holes) are mainly generated in the n-depletion layer.

(In the Case of np$^-$)

The p-ZnMgSSe layer has carrier concentration smaller than the n-ZnMgSSe layer. The reverse bias makes a wider p-depletion layer and a narrower n-depletion layer. Almost all of the incidence light is absorbed in the wider p-depletion layer. Photocurrent (electrons and holes) are mainly generated in the p-depletion layer.

In the present invention, the mixture crystal $Zn_{1-x}Mg_xS_ySe_{1-y}$ takes x=0 to 0.8 and y=0 to 0.8. However, since the $Zn_{1-x}Mg_xS_ySe_{1-y}$ crystal should satisfy lattice fitting condition with the n-ZnSe substrate, an arbitrary set of x and y cannot be realized.

Regarding the component of the p- and n-layers, the p-layer can have the same component and the same bandgap as the n-layer. When the p-layer has a wider bandgap than the n-layer, the incidence light is not absorbed in the p-layer, which enhances sensitivity.

The ZnSe-type avalanche photodiode of the present invention has a following layered structure from the bottom to the top.

| | |
|---|---|
| 1. metallic n-electrode | Au—In, In, In—Au—Ge, Au/Ti |
| 2. substrate | n-ZnSe |
| 3. buffer layer | n-ZnSe |
| 4. n-layer | n-ZnSe, n-ZnSSe, n-ZnMgSSe |
| 5. p-layer | p-ZnSe, p-ZnSSe, p-ZnMgSSe |
| 6. superlattice electrode | p-(ZnTe/ZnSe)$^m$ |
| 7. contact layer | p-ZnTe |
| 8. antireflection layer | $Al_2O_3$, $SiO_2$, $HfO_2$, $TiO_2$, SiN, or a set of them |
| 9. metallic p-electrode | Au—Pd—Pt, Au—Pt, Au |

The carrier density of the p- and n-layers is described. The p-dopant is nitrogen (N) and the n-dopant is chlorine (Cl). Here, "n" means a carrier density of the n-layer and "p" means a carrier density of the p-layer. An APD can alternately take an n$^-$p type (n<<p) and an np$^-$ type (n>>p). In the case of the n$^-$p type, a wide depletion layer is made in the n-layer in contact with a pn-junction. The n-depletion layer mainly absorbs light and produces photocarriers (electrons and holes). In the case of the np$^-$ type, a wide depletion layer is made in the p-layer in contact with the pn-junction. The p-depletion layer mainly absorbs light and produces photocarriers (electrons and holes).

The top ZnTe contact layer has the highest carrier (holes) concentration. The ZnTe layer has been doped with high density p-dopants (nitrogen) for making a low-resistance ohmic contact with the metallic p-electrode. A desirable carrier concentration of the p-ZnTe contact layer is $p=10^{19}$ $cm^{-3}$ to $5 \times 10^{19}$ $cm^{-3}$.

Figure 4:
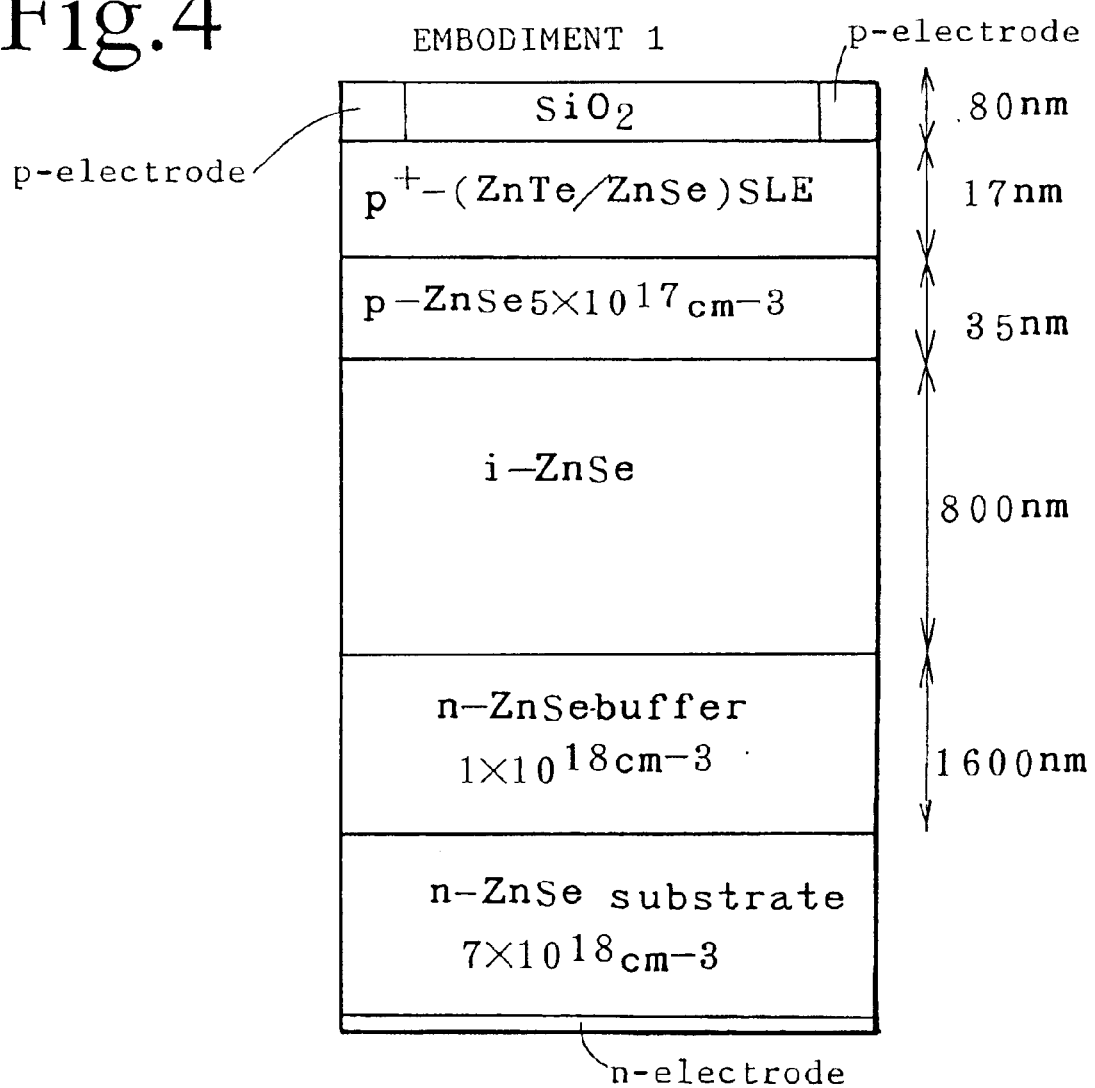
FIG. 4 is a layered structure of a ZnSe pin-photodiode of Embodiment 1 having an n-ZnSe substrate and an i-ZnSe layer.

[Embodiment 1 (ZnSe Pin-PD; FIG. 4)]

Embodiment 1 is a ZnSe pin-photodiode having an i-ZnSe layer, a p-ZnSe layer and an n-buffer layer without an n-ZnSe layer. FIG. 4 shows a layered structure of Embodiment 1. Table 3 indicates the same layered structure. Description of sensing properties precedes description of device-manufacturing, dark current, noise and reliability.

TABLE 3

Layered structure of the ZnSe pin-PD of Embodiment 1

| | Material | Thickness/concentration |
|---|---|---|
| Antireflection/protection film | $SiO_2$ | 80 nm |
| Metallic p-electrode | Au | |
| Superlattice electrode (SLE) | p-(ZnTe/ZnSe)$^m$ | 17 nm |
| P-window layer | p-ZnSe | 35 nm |
| | | $p = 5 \times 10^{17}$ $cm^{-3}$ |
| I-layer | i-ZnSe | 800 nm |
| | | $n < 10^{16}$ $cm^{-3}$ |
| N-buffer layer | n-ZnSe | 1600 nm |
| | | $n = 10^{18}$ $cm^{-3}$ |
| Substrate | n-ZnSe | $n = 7 \times 10^{18}$ $cm^{-3}$ |
| Metallic n-electrode | Au—In | |

Embodiment 1 allocates a 800 nm thickness to the i-ZnSe layer for absorbing fully the incidence light in the thick i-ZnSe layer. The n-ZnSe buffer layer enables Embodiment 1 to omit an n-ZnSe layer just below the i-layer. The thin (80 nm) $SiO_2$ layer is an antireflection film for reducing reflection on the top of the photodiode. A simple antireflection film should have a thickness of λ/4n (n: refractive index of the film). The superlattice (ZnTe/ZnSe)$^m$ SLE which is a reciprocal pile of a plurality of ZnTe films and ZnSe films has a 17 nm thickness. The top layer of the SLE is a ZnTe layer.

[Sensing Properties of Embodiment 1 ZnSe-PD]

Figure 5:
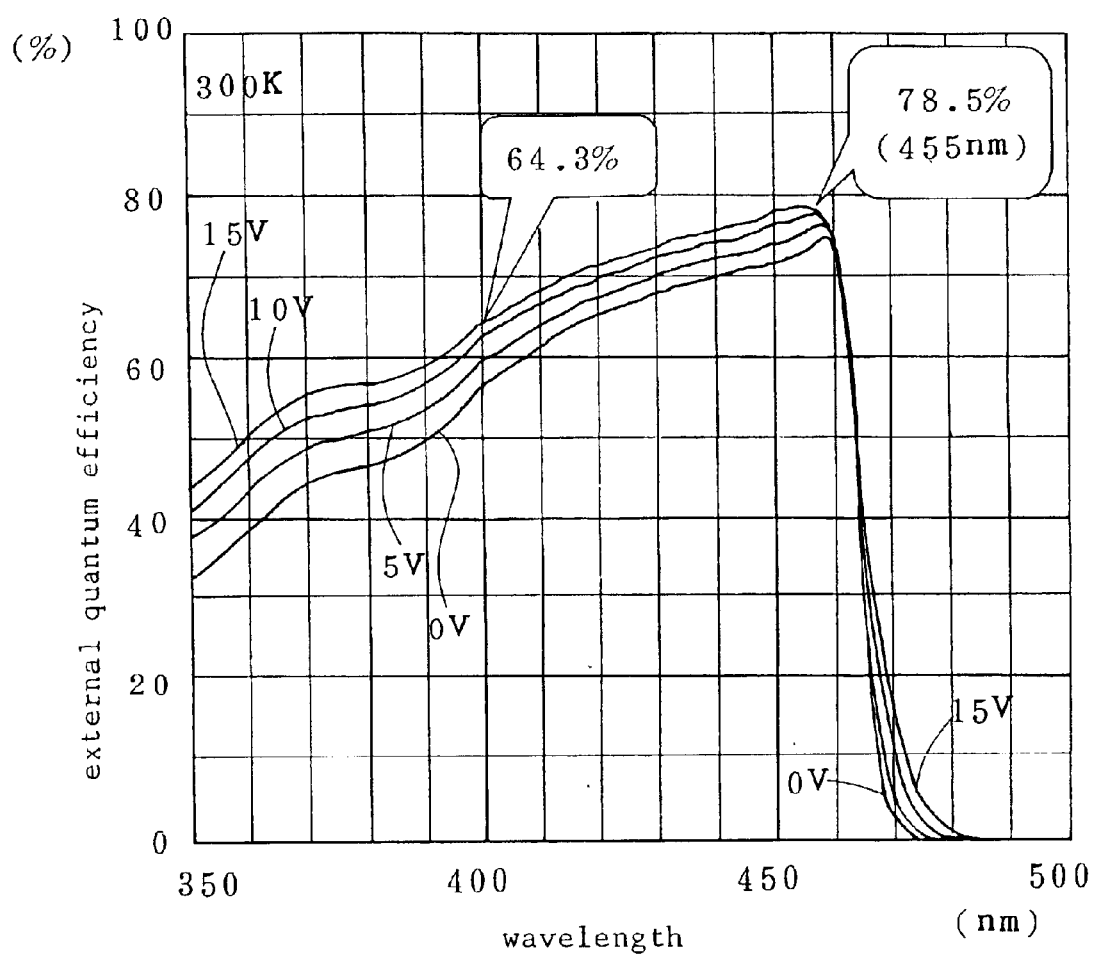
FIG. 5 is a graph showing a wavelength dependence of external quantum efficiency of the ZnSe photodiode of Embodiment 1 having the n-ZnSe substrate and the i-ZnSe layer.

FIG. 5 shows a measured external quantum efficiency of Embodiment 1 with different reverse bias as a function of wavelength. The abscissa is wavelength (350 nm-500 nm). The ordinate is an external quantum efficiency (%). Without the reverse bias ($V_b$=0), the external quantum efficiency is 75% at 460 nm. Falling rapidly beyond 460 nm, the quantum efficiency drops to zero at 475 nm.

A 5V reverse bias raises the efficiency by about 2 to 3% from the zero-bias in a wavelength region shorter than 455 nm. The reverse bias lifts up the quantum efficiency in proportion. A $V_b$=15V reverse bias enables the Embodiment 1 photodiode to take the peak quantum efficiency of 78.5% at 455 nm. A wavelength range between 394 nm and 462 nm allocates the photodiode with quantum efficiency higher than 60%.

[Production of Embodiment 1 PD (Common to the Following Embodiments)]
1. Growth of a ZnSe Single Crystal Substrate (Iodine Transportation Method; Heat Treatment)

The Czochralski method or Bridgman method which are prevailing for ordinary crystal growth are inapplicable to the growth of a ZnSe single crystal substrate, because heating cannot prepare a (100)-plane ZnSe melt. This invention makes a bulk ZnSe single crystal by a Chemical Vapor Transport (CVT) method. FIG. 6 demonstrates the CVT method. A ZnSe polycrystal 87 is stored on the bottom of a growth chamber 86. A ZnSe single crystal seed 89 is fixed on a ceiling of the growth chamber 86. The growth chamber 86 is filled with iodine gas ($I_2$). The bottom polycrystal 87 is heated and maintained at a higher temperature $T_1$. The ceiling seed 89 is maintained at a lower temperature $T_2$ ($T_1 > T_2$). The bottom ZnSe material 87 heated at $T_1$ reacts with the atmospheric iodine gas in accordance with a reaction equation,

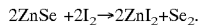

$$2ZnSe + 2I_2 \rightarrow 2ZnI_2 + Se_2.$$

Gaseous $ZnI_2$ rises in the growth chamber 86. $Se_2$ gas also lifts up in the chamber 86 near the ceiling seed 89. Since the seed 89 is cooler than the gaseous $ZnI_2$ and $Se_2$, the ZnSe seed 89 induces a reverse reaction denoted by another equation,

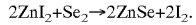

$$2ZnI_2 + Se_2 \rightarrow 2ZnSe + 2I_2.$$

Gaseous $I_2$ returns to the atmospheric $I_2$ in the chamber. ZnSe molecules epitaxially adhere to the ceiling ZnSe single crystal seed 89 in the same orientation as the seed 89. Thus, a single crystal ZnSe is gradually grown at a low speed of e.g., 1 mm/day. The growth temperature $T_2$ is about 850° C. The method is alternatively called an iodine transportation method, since iodine atoms ($I_2$) carry zinc (Zn) atoms.

Figure 7:
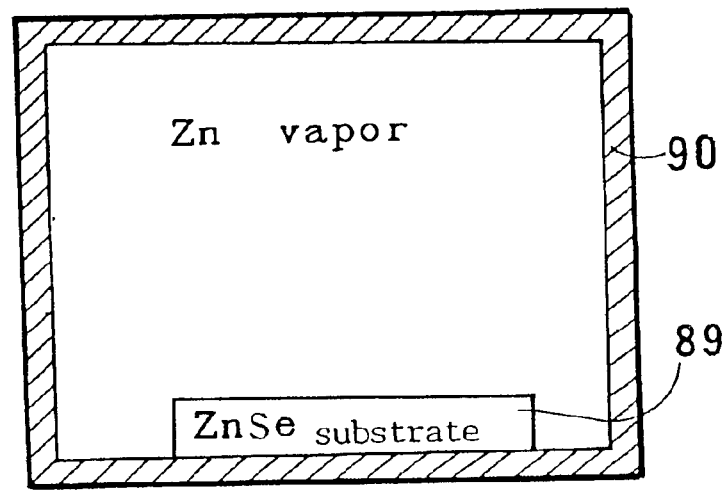
FIG. 7 is a sectional view of a heat-treatment apparatus for treating an n-ZnSe single crystal.

The single crystal ZnSe grown by the CVT method still has many defects. The poor crystallographical property should be remedied. Then, the as-grown ZnSe crystal is further heat-treated at 1000° C. for 50 hours in a heat-treatment chamber as shown in FIG. 7. The heat-treated ZnSe is cooled at a rate of 60° C. per minute. The heat-treatment improves the sample into a low-defect density ZnSe crystal.

The ZnSe crystal has not been actively doped with a dopant. But, the transportation medium, iodine ($I_2$), is naturally included in the ZnSe. The naturally-doped iodine (I) atoms act as an n-type dopant by replacing Se sites in the ZnSe crystal. The CVT and the heat-treatment produce a low-defect density n-type ZnSe single crystal with a carrier density of $5 \times 10^{17}$ cm$^{-3}$ to $5 \times 10^{18}$ cm$^{-3}$. A single crystal ZnSe substrate of a 400 µm thickness is prepared by cutting and polishing the grown ZnSe crystal.

2. Epitaxial Growth (Film Production by Molecular Beam Epitaxy; MBE)

Then, a molecular beam epitaxy method piles an n-ZnSe buffer layer, an i-ZnSe layer, a p-ZnSe layer and a superlattice electrode (SLE;ZnTe/ZnSe) in series upon the single crystal ZnSe substrate.

Figure 8:
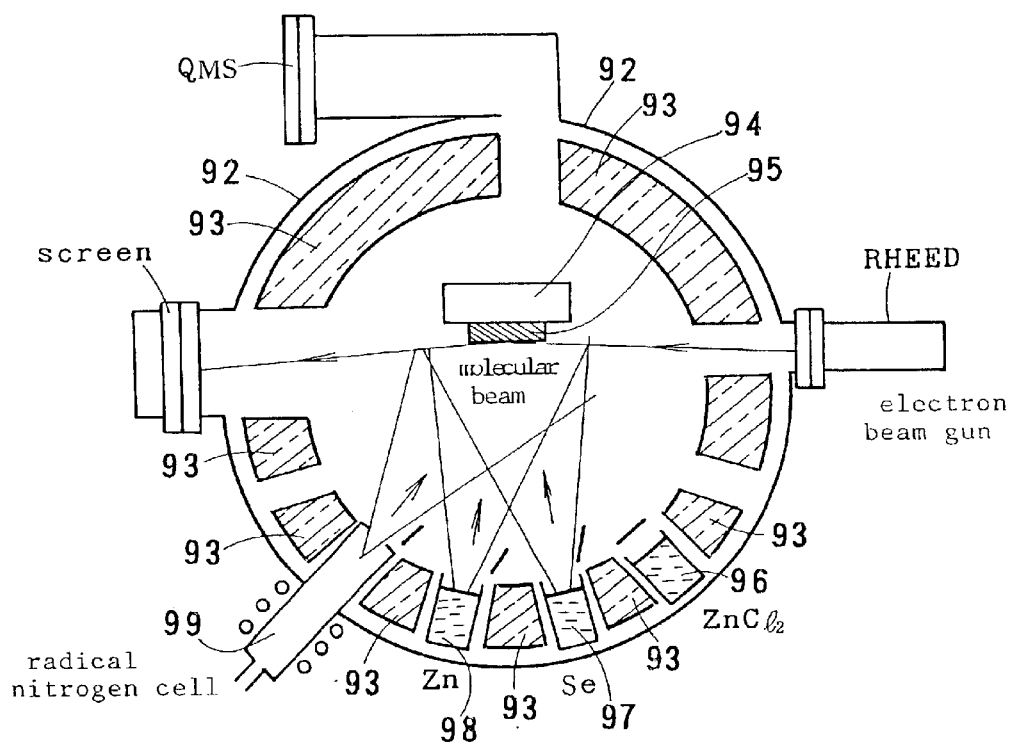
FIG. 8 is a sectional view of an MBE apparatus for growing an n-ZnSe buffer layer, an n-ZnMgSSe layer, an i-ZnMgSSe layer, a p-ZnMgSSe layer, a p-(ZnTe/ZnSe)$^m$ superlattice layer (SLE), and a p-ZnTe layer on an n-ZnSe single crystal substrate.

FIG. 8 demonstrates an MBE (molecular beam epitaxy) apparatus. The MBE chamber 92 is a ultrahigh vacuum chamber containing liquid nitrogen shrouds 93 on the inner wall. A vacuuming apparatus (not shown) lying outside of the chamber makes a ultrahigh vacuum of $10^{-8}$ Pa in the chamber by two-step vacuum pumps.

The MBE apparatus has a susceptor 94 at a center. The prepared single crystal n-type ZnSe substrate 95 is attached upon the susceptor 94. A plurality of molecular beam cells (or K-cells) 96, 97 and 98 are installed at spots on a bottom circle of an imaginary cone having a top at the substrate 95. The molecular beam cells contain materials of making films or impurities of determining conduction properties of the films and make molecular beams of the materials or the impurities by heating and evaporating. FIG. 8 shows a $ZnCl_2$ molecular beam cell (K-cell; $ZnCl_2$-cell) 96, a Se molecular beam cell 97 and a Zn molecular beam cell 98. These cells cooperate to produce ZnSe films.

In addition to the Zn-, $ZnCl_2$- and Se-cells, the apparatus is equipped with a Cd-cell, a Mg-cell, a S-cell and a Te-cell for making ZnMgSSe mixture crystal films of arbitrary mixture rates. The $ZnCl_2$-cell plays a role of supplying ZnMgSSe films with chlorine (Cl) as an n-type dopant. Cl atoms act as an n-type dopant by replacing the 6 group elements S or Se in the mixture crystal films.

Knudsen cells are employed for making molecular beams of these materials Zn, Se, $ZnCl_2$, Cd, Mg, S and Te, since these materials are solid at room temperature and are converted into a melt by heating.

As mentioned before, it was difficult to make a p-type ZnSe, since ZnSe has a wide bandgap. There were some dopant candidates which were expected to act as a p-dopant in ZnSe. However, all the known p-dopant candidates failed in infiltrating into ZnSe. For example, an alkali metal, e.g. lithium (Li) seems to be a pertinent p-dopant candidate for ZnSe, since a Li atom would replace a Zn atom and would supply an extra hole. But, Li is actually repulsed by ZnSe crystal. Li cannot be a good p-dopant for ZnSe. Nitrogen is employed as a p-dopant in MBE. Discovery of nitrogen as a p-dopant enabled the MBE to make a p-type ZnSe crystal. However, doping of nitrogen required a long series of trials. Since nitrogen is a gas at room temperature, a nitrogen molecular beam ($N_2$) can be easily made by a gas source cell. But a simple $N_2$ molecular beam does not infiltrate into the ZnSe crystal due to inherent inactiveness of nitrogen. Another candidate compound of nitrogen is ammonia ($NH_3$) which is a gas at room temperature. However, ammonia is not a suitable p-dopant, because ammonia contains hydrogen. Hydrogen would be an impurity for degrading the property of ZnSe.

A radical cell was invented for making a radical nitrogen beam for doping an object film with nitrogen in MBE. The radical cell makes nitrogen plasma by exciting nitrogen gas by microwave, rf-power, etc. Neutral nitrogen molecules have no activity but radical nitrogen atoms which are made from nitrogen plasma have high activity for infiltrating into growing films in MBE. The invention of the nitrogen radical cell (otherwise called "cracker cell") enables MBE to make a p-type ZnSe film for the first time. Many p-type dopants for ZnSe have been known but none of them except nitrogen can be actually infiltrated by doping in an MBE-growing ZnSe still now. The problem of a p-type impurity doping has been solved by the nitrogen cracker cell. In the embodiment, when a p-type ZnSe film should be grown, nitrogen plasma is introduced into the growing crystal by the cracker cell (radical cell) 99.

When an n-type ZnSe is grown, chlorine (Cl) is supplied into the growing ZnSe crystal from a $ZnCl_2$-cell as an n-dopant.

The growth temperature is 200° C. to 380° C. A volume ratio of the 6th group elements (Se and S) to the 2nd group elements (Zn and Mg) is one to five. The growth rate is 0.1 µm to 1 µm/hour. Embodiment 1 grows a 1600 nm thick n-ZnSe buffer layer, an 800 nm thick i-ZnSe layer, a 35 nm thick p-ZnSe layer and a 17 nm thick p-ZnTe/ZnSe superlattice electrode (SLE) in series in the MBE apparatus. The p-ZnTe/ZnSe superlattice electrode will be later described more in detail.

The top layer p-ZnTe of the p-ZnTe/ZnSe superlattice electrode is sometimes called a p-ZnTe contact layer. A p-metallic electrode made of gold (Au) is produced upon the top p-ZnTe contact layer. The Au p-electrode is shaped in a ring or in a small dot for allowing sufficient light to go into the photodiode. An In n-electrode is formed on the bottom of the n-ZnSe substrate. After the n-electrodes and the p-electrodes are formed on individual chip units, the ZnSe wafer is cut crosswise and lengthwise along cleavage lines into plenty of individual PD chips. The PD chip is mounted with the In n-electrode downward upon a package. The top p-electrode is coupled to a lead pin of the package by wire-bonding.

[Uniformity of Spatial Sensitivity of the Embodiment 1 PD]

Figure 9:
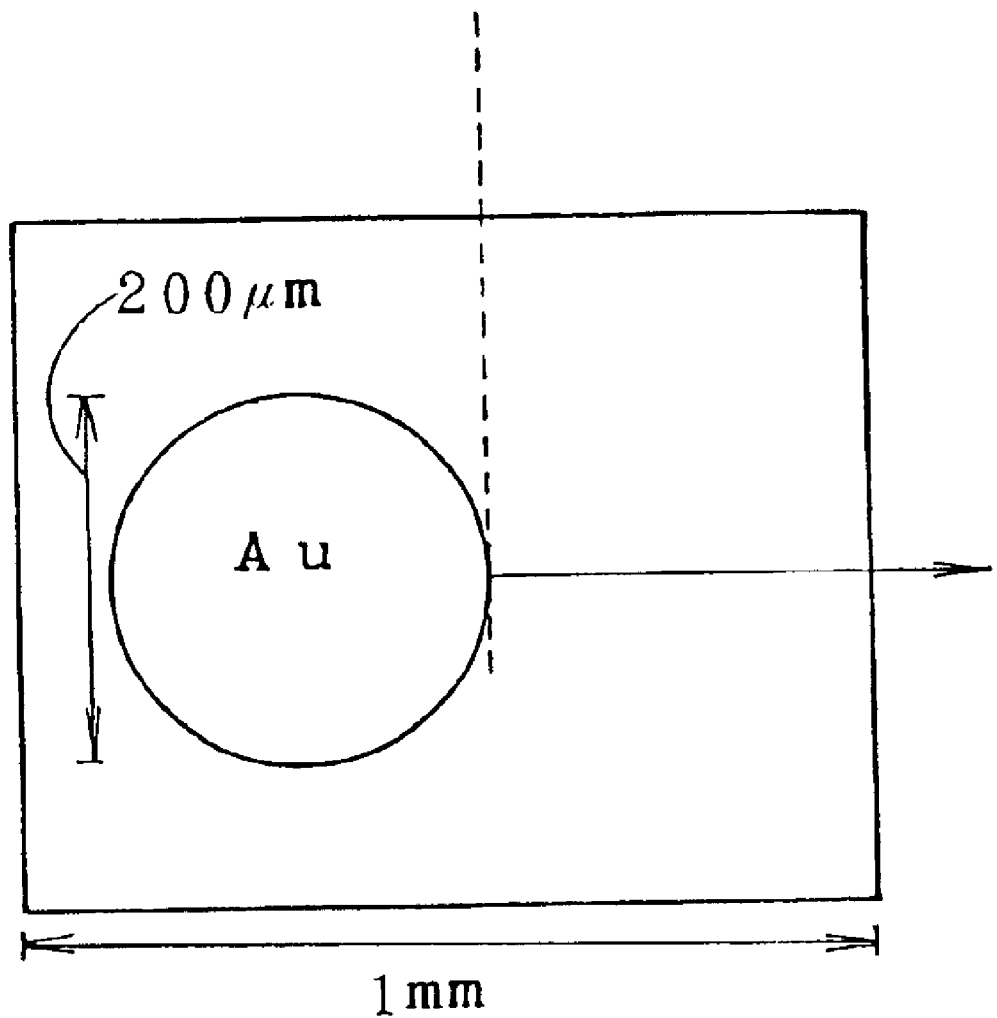
FIG. 9 is a plan view of a ZnSe photodiode of Embodiment 1 having an n-ZnSe substrate, an i-ZnSe layer and a 200 μm diameter round gold (Au) electrode on the top.

Embodiment 1 is provided with an extraordinary wide light receiving region of a 1000 $\mu$m (1 mm) long diameter. The reason for giving a light receiving surface such a very wide aperture (1 mm) is to investigate spatial fluctuation of sensitivity. FIG. 9 shows the top of the light receiving surface of the Embodiment 1 photodiode. A round Au (gold) p-electrode of a 200 $\mu$m diameter is formed on the top. The top surface of Embodiment 1 is scanned along the central line by a 0.2 mm $\phi$ beam of He—Cd laser of a 442 nm wavelength. The spatial change of external quantum efficiency is calculated by measuring photocurrent flowing in the photodiode in accordance with the scanning spot of the laser beam at 300K.

Figure 10:
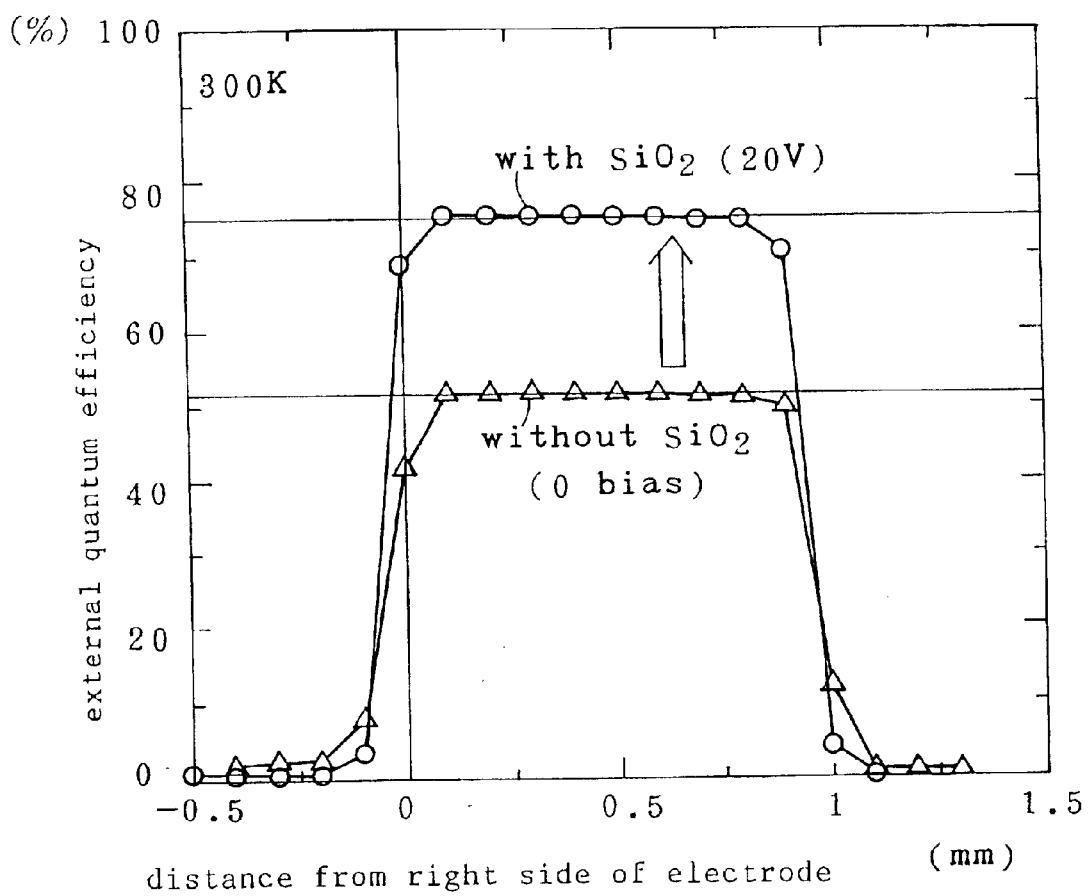
FIG. 10 is a graph of external quantum efficiency measured by irradiating the ZnSe-photodiode by the 442 nm light of a helium cadmium laser along a center line on the photodiode of Embodiment 1 having an n-ZnSe substrate, an i-ZnSe layer and a 200 μm diameter round gold (Au) electrode on the top. ◯ 0 denotes the quantum efficiency of a ZnSe photodiode having an SiO$_2$ protection layer and being reversely biased with −20V. Δ denotes the quantum efficiency of another photodiode without the reverse bias and without the SiO$_2$ protection layer.

FIG. 10 shows a result of the measurement of the spatial quantum efficiency. The abscissa is a distance x (mm) from the right edge of the Au electrode. The ordinate is the external quantum efficiency (%). Round dots denote a result of the photodiode with an 80 nm thick $SiO_2$ antireflection film at a reverse bias of $V_b$=20V. The 20 V biased antireflection film coated PD has a uniform 76% quantum efficiency in a 1 mm wide range. Triangle dots indicate another result of another photodiode with no reverse bias and no antireflection film. The non-bias, non-antireflection photodiode shows uniform 51% quantum efficiency in a 1 mm wide rage. The spatial uniformity is one of important conditions of good photodiodes.

[Comparison of Dark Current of Embodiment 1 with Other Kinds of PDs]

Dark current is a current flow induced by the reverse bias without irradiation of light. Large dark current is a fatal defect of a photodiode. The dark current deprives the PD of proportional relation between light power and photocurrent, distorts waveforms of signal light and prevents the PD from measuring exact light power. Low dark current is another significant property of photodiodes.

Figure 11:
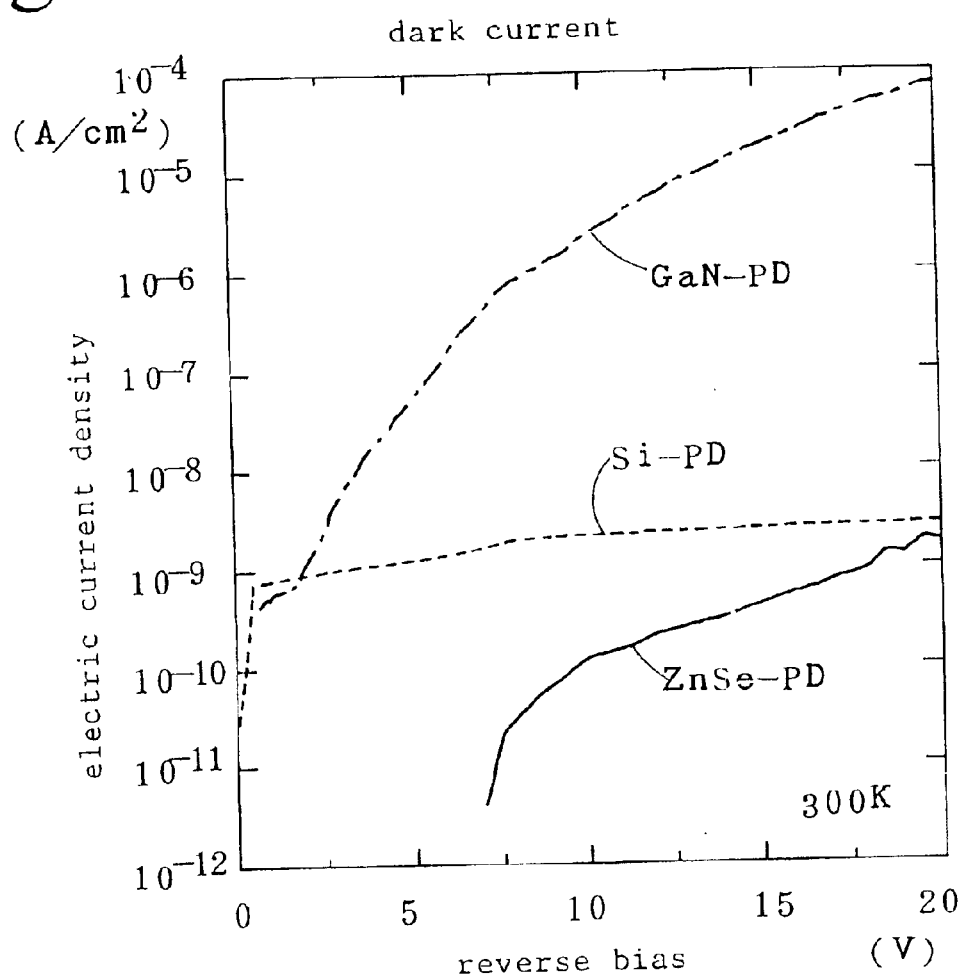
FIG. 11 is a graph of dark currents of a known Si pin-PD, a tentatively-prepared GaN pin-PD and a ZnSe pin-PD of the present invention which are measured at 300 K with applying reverse biases. The abscissa is the reverse bias. The ordinate is dark current density (A/cm$^2$).

FIG. 11 shows dark currents of an Si pin-PD, the ZnSe pin-PD (Embodiment 1), and a GaN pin-PD as a function of the reverse bias. The abscissa is the reverse bias (V). The ordinate is current density in a logarithmic scale ($A/cm^2$).

The dark current of the GaN-PD is $10^{-6}$ $A/cm^2$ at a reverse bias of 10 V and rises to $10^{-4}$ $A/cm^2$ at a 20 V reverse bias. The large dark current is more fatal drawback of the GaN-PD than low sensitivity. The big dark current of the GaN-PD derives from large dislocation density owing to the misfit between GaN and sapphire. The dark current of the Si pin-PD is not strongly changed by the reverse bias. The dark current is about $10^{-9}$ $A/cm^2$ for the Si-PD for the range of the reverse bias.

The ZnSe pin-PD of Embodiment 1 has very small dark current. The dark current is $10^{-10}$ $A/cm^2$ at a 10V reverse bias. The ZnSe pin-PD is far superior to the GaN-PD or the Si-PD in the dark current.

[Comparison of NEP of Embodiment 1 ZnSe-PD with Other PDs]

Noise equivalent power is defined as incidence light power which induces photocurrent equal to noise current per Hz. Table 4 shows the NEP for the Si-PD, the ZnSe-PD of the present invention and the GaN-PD. Lower NEP means that the PD can sense lower light power. Low NEP is one of important properties of PDs.

TABLE 4

NEP of Si-PD, ZnSe-PD and GaN-PD

|  | NEP (WHz$^{-1/2}$ cm$^{-2}$) |
| --- | --- |
| Si-PD | 1.7 × 10$^{-13}$ |
| ZnSe-PD | 7.2 × 10$^{-15}$ |
| GaN-PD | 3.7 × 10$^{-9}$ |

[Aging Test of Embodiment 1 ZnSe-PD]

Unlike laser diodes, large current does not flow in photodiodes. Thus, photodiodes are not degraded by current flow. The PD of Embodiment 1 is examined by a 300 hour aging test to confirm longterm stability of Embodiment 1.

Figure 12:
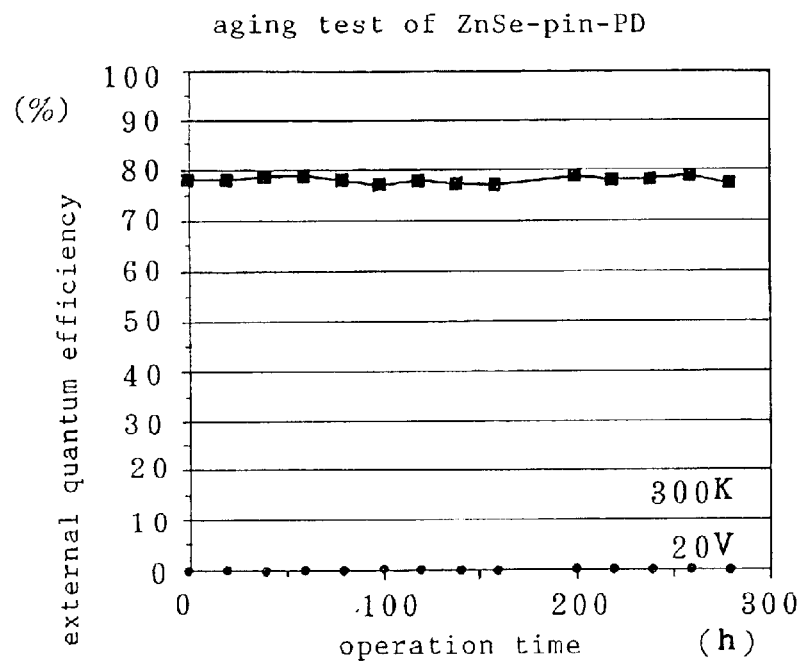
FIG. 12 is a graph of changes of external quantum efficiency of the ZnSe pin-photodiode of the present invention after a 300 hour aging treatment.

FIG. 12 is a graph for showing a change of external quantum efficiency induced by the aging test of the ZnSe-pin-PD of Embodiment 1 measured at 300K with a 20V reverse bias. The abscissa is aging time (0 to 300 hours). The ordinate is external quantum efficiency. The external quantum efficiency is about 77% to 79% in the range of 0 to 300 hours. 300 hour operation does not degrade the ZnSe-PD of Embodiment 1.

Figure 13:
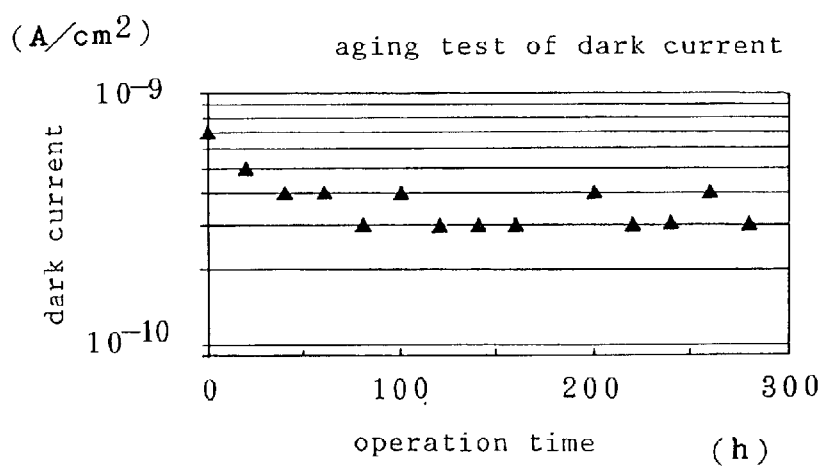
FIG. 13 is a graph of changes of dark current of the ZnSe pin-photodiode of the present invention after a 300 hour aging treatment.

FIG. 13 is a graph for showing a change of dark current induced by the same aging test of the ZnSe-PD. Initially, the dark current is nearly 7×10$^{-10}$ $A/cm^2$. The dark current gradually falls to 3×10$^{-10}$ $A/cm^2$. The result of the aging test confirms longterm reliability of the ZnSe-PD of the present invention.

Figure 14:
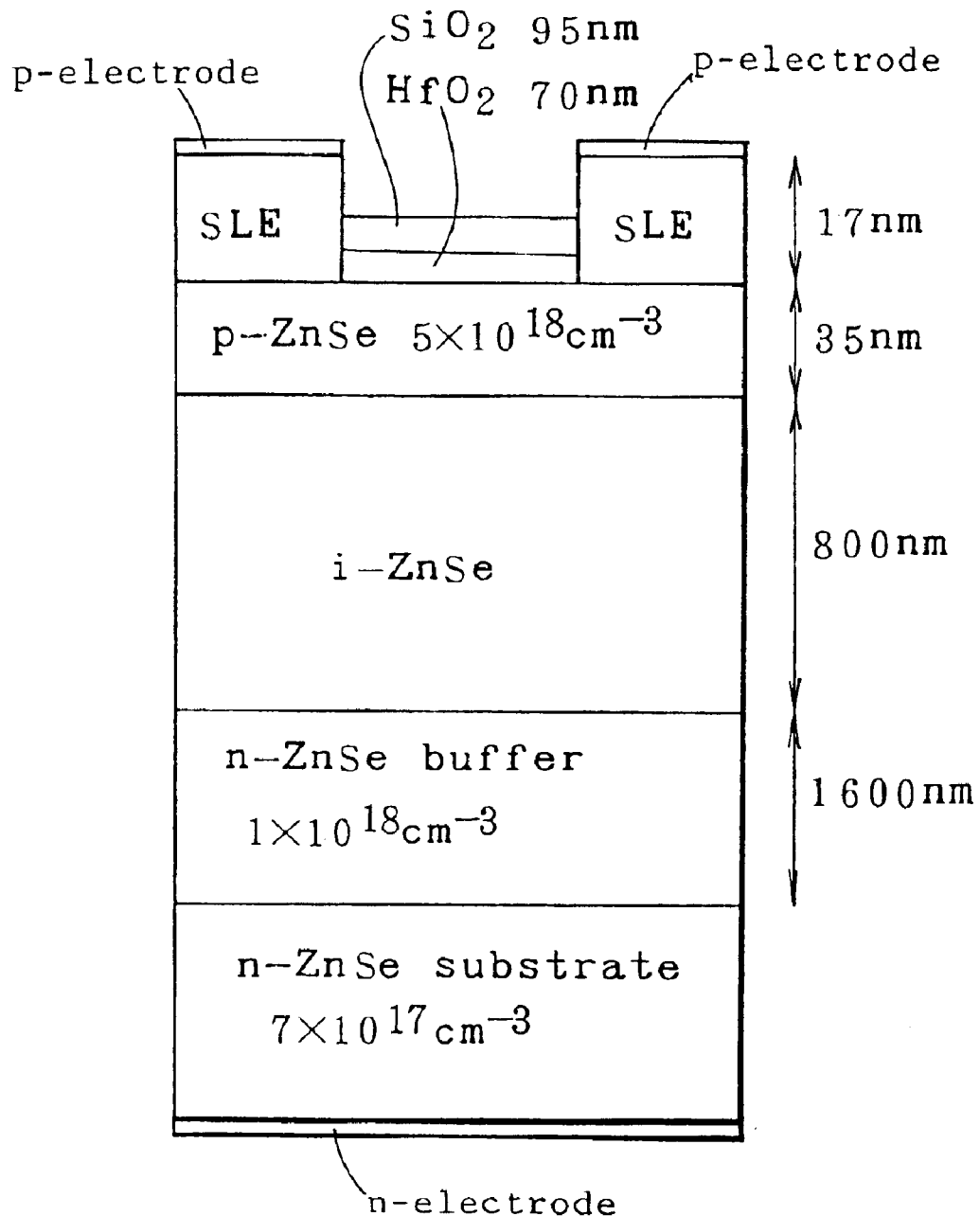
FIG. 14 is a layered structure of an improved ZnSe pin-photodiode of Embodiment 1 having an annular p-(ZnTe/ZnSe)$^m$ superlattice electrode (SLE) and a central SiO$_2$HfO$_2$ antireflection layer on a top p-ZnSe layer for allowing incidence light to arrive at a pn-junction without passing the p-(ZnTe/ZnSe)$^m$ superlattice electrode.

[Improvement of Embodiment 1 (Restriction the SLE Layer to the Peripheral Region; FIG. 14)]

Embodiment 1 selects ZnSe for the materials of the i-layer and the n-layer, as shown in FIG. 4. The p-electrode is formed upon the top of the SLE (superlattice electrode) from which a part of the $SiO_2$ protection layer is removed. In the previous structure, the incidence light passes through the SLE. Since the incidence light should be absorbed and sensed by the i-ZnSe layer, the light has a wavelength shorter than the bandgap wavelength of ZnSe. Thus, a part of the incidence light is absorbed by the ZnTe layers in the SLE. To reduce the absorption loss in the SLE, the thickness of the SLE is designed to be very thin (e.g., 17 nm). Elimination of the ZnTe layers on the light path would enhance the sensitivity.

FIG. 14 shows an improvement of the ZnSe-PD of Embodiment 1. The improved PD has a square ring MQW (multiquantum well=superlattice electrode; SLE) and a square ring p-electrode on the p-ZnTe layer. Transparent thin antireflection (protection) layer ($SiO_2$/$HfO_2$) is formed on the extra central part of the p-electrode. Incidence light can arrive at the p-ZnSe and the i-ZnSe layer without being absorbed in the SLE. Since the p-electrode has enough conductivity, the reverse voltage is uniformly applied to the junction between the p-layer and the i-layer. The ring-shaped SLE and p-electrode can be applied to the following embodiments for reducing the absorption loss in the SLE.

Figure 15:
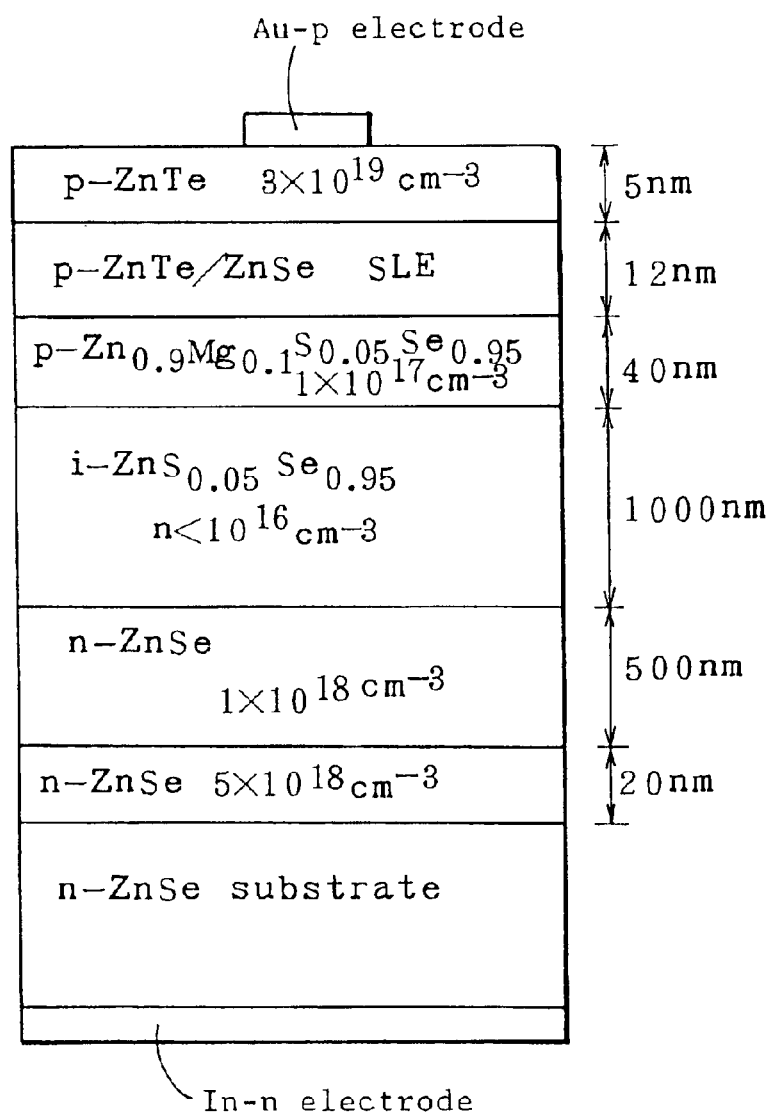
FIG. 15 is a layered structure of a ZnSe pin-PD of Embodiment 2 having an n-ZnSe substrate and an i-ZnSSe layer.

[Embodiment 2 (ZnSSe Pin-PD; FIG. 15)]

FIG. 15 shows Embodiment 2 having an n-ZnSe layer, an i-ZnS$_y$Se$_{1-y}$ layer and a p-Zn$_{1-x}$Mg$_x$S$_y$Se$_{1-y}$ layer. Embodiment 2 has a wider bandgap of a window layer (p-$Zn_{1-x}Mg_xS_ySe_{1-y}$ layer) than Embodiment 1. The component ratios x and y are determined by fitting the lattice constant of the layers to the ZnSe substrate. Widening of the bandgaps of the p-, i-, and n-layers raises sensitivity for short wavelength light. The sensitivity range extends to near-ultraviolet rays. The quantum efficiency at 400 nm is enhanced up to 80% by the wider bandgap i- and p-layers.

As shown in FIG. 15, Embodiment 2 PD has the following layered structure up to down.

| | |
|---|---|
| Au(gold) electrode (p-electrode) | $\phi$ = 1.0 mm |
| p-ZnTe contacting layer | p = 3 × $10^{19}$ cm$^{-3}$    d = 5 nm |
| p-(ZnTe/ZnSe)$^m$ superlattice electrode (SLE) | d = 12 nm |
| p-$Zn_{0.9}Mg_{0.1}S_{0.05}Se_{0.95}$ layer | p = 1 × $10^{17}$ cm$^{-3}$    d = 40 nm |
| i-$ZnS_{0.05}Se_{0.95}$ layer | n < $10^{16}$ cm$^{-3}$    d = 1000 nm |
| n-ZnSe layer | n = 1 × $10^{18}$ cm$^{-3}$    d = 500 nm |
| n-ZnSe buffer layer | n = 5 × $10^{18}$ cm$^{-3}$    d = 20 nm |
| n-ZnSe substrate | n = 7 × $10^{17}$ cm$^{-3}$ |
| n-metallic electrode Au/Ti | |

The absorption edge wavelength (bandgap wavelength) is 463 nm for ZnSe (x=0). A rise of the S mixture rate x raises the bandgap energy Eg and lowers the bandgap wavelength $\lambda$g. For x=5.5% ($ZnS_{0.005}Se_{0.945}$), the absorption edge wavelength is 455 nm. For x=8% ($ZnS_{0.08}Se_{0.92}$), the absorption edge wavelength is 451 nm. An increase of a S ratio (x) moves the sensitivity region toward near-ultraviolet rays through a decrease of the absorption edge wavelength.

Figure 16:
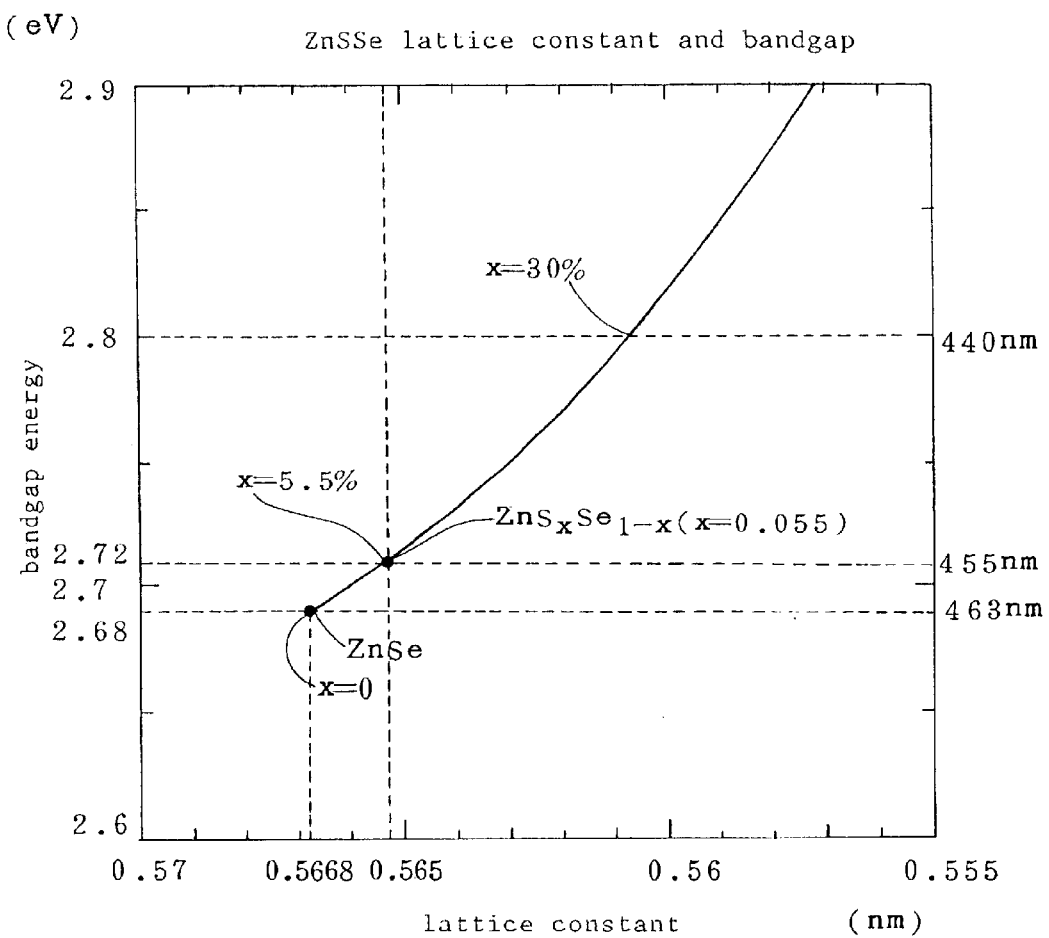
FIG. 16 is a graph showing changes of bandgap energy and lattice constants of a ZnS$_x$Se$_{1-x}$ mixture crystal as a function of an S-mixture rate x.

FIG. 16 shows the relation between the lattice constant (nm) of ZnSSe and the bandgap energy Eg (eV) both of which are functions of the mixture ratio x. A rise of x (S ratio) shortens the lattice constant.

Figure 17:
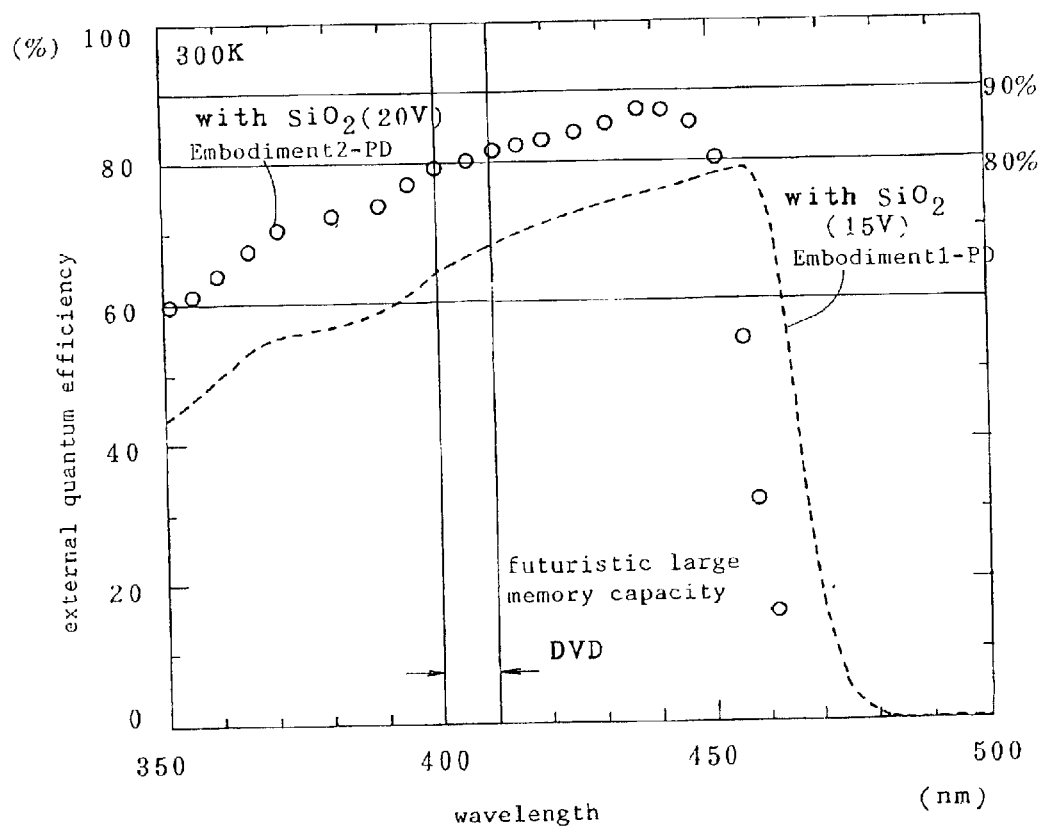
FIG. 17 is a graph showing wavelength dependence of external quantum efficiency of the ZnSe pin-photodiode of Embodiment 1 (dotted line) having an n-ZnSe substrate and an i-ZnSe layer and another ZnSe pin-photodiode of Embodiment 2 (round dots) having an n-ZnSe substrate, an i-ZnSSe layer and a p-ZnMgSSe layer.

FIG. 17 shows the external quantum efficiency as a function of wavelength of Embodiment 1 (ZnSe-PD) with an $SiO_2$ film and Embodiment 2 (ZnSSe-PD) with an $SiO_2$ film. Dotted line which shows the quantum efficiency of Embodiment 1 rises to about 467 nm. Discrete rounds which denote the quantum efficiency of Embodiment 2 rises to about 450 nm. Embodiment 2 has larger sensitivity in ultraviolet range by 10% to 20% than Embodiment 1. The sensitivity range is displaced toward the shorter wavelength region by Embodiment 2.

[Embodiment 3 (p-ZnSSe/i-,n-ZnSe; Table 5)]

Embodiment 3 selects ZnSe for an n-layer and i-layer and $ZnS_ySe_{1-y}$ for a p-layer. A suitable range of a S rate (x) is 0.6% to 8% in the present invention. Table 5 indicates a p-$ZnS_{0.07}Se_{0.93}$ layer of x=7%. Embodiment 3 aims at widening a bandgap of a window layer (p-layer). The lattice fitting condition determines x=0.07 for Embodiment 3. The lower i-layer and the n-layer are ZnSe. The upper (window) p-layer has a wider bandgap than the i-layer and the n-layer. The wide-bandgap p-layer alleviates the absorption of the incidence light in the p-(window) layer. Table 5 denotes a layered structure of Embodiment 3.

TABLE 5

ZnSSe-PD of Embodiment 3 for ultraviolet-violet rays

| | Material | Thickness/concentration |
|---|---|---|
| Antireflection film | $Al_2O_3$ | d = 60 nm |
| P-metal electrode | Au—Pt | |
| P-contact layer | p-ZnTe | d = 10 nm<br>p = $10^{19}$ cm$^{-3}$ |

TABLE 5-continued

ZnSSe-PD of Embodiment 3 for ultraviolet-violet rays

| | Material | Thickness/concentration |
|---|---|---|
| Superlattice electrode(SLE) | p-(ZnTe/ZnSe)$^m$ | five periods (10 films) |
| P-window layer | p-$ZnS_{0.07}Se_{0.93}$ | d = 30 nm<br>p = $10^{17}$ cm$^{-3}$ |
| I-layer | i-ZnSe | d = 600 nm<br>n < $10^{16}$ cm$^{-3}$ |
| N-layer | n-ZnSe | d = 400 nm<br>n = $10^{17}$ cm$^{-3}$ |
| N-buffer layer | none | |
| Substrate | n-ZnSe | n = $10^{17}$ cm$^{-3}$ |
| N-electrode | Au/Ti | |

Figure 18:
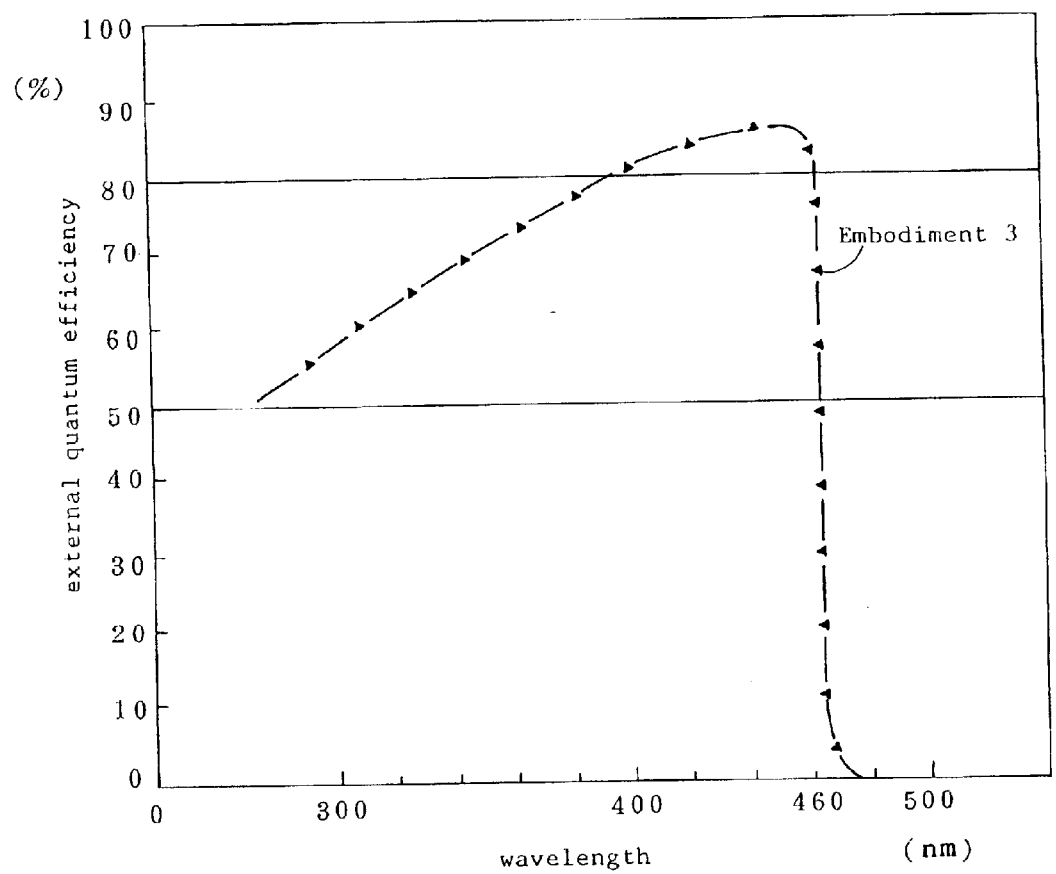
FIG. 18 is a graph showing wavelength dependence of external quantum efficiency of a ZnSe pin-photodiode of Embodiment 3 (triangle dots) having an n-ZnSe substrate, an i-ZnSe layer and a p-ZnSSe layer.

Dark current $I_d$ of Embodiment 3 is less than 1 pA/mm$^2$ ($I_d$<1 pA/mm$^2$) at a 20 V reverse bias ($V_b$=20V). FIG. 18 shows the external quantum efficiency $\eta_{ex}$ of Embodiment 3 PD as a function of wavelength.

$\eta_{ex}$=85% at 460 nm of wavelength (maximum efficiency).
$\eta_{ex}$=80% at 400 nm of wavelength (violet for HD-DVD).
$\eta_{ex}$=55% at 300 nm of wavelength (ultraviolet).

Figure 19:
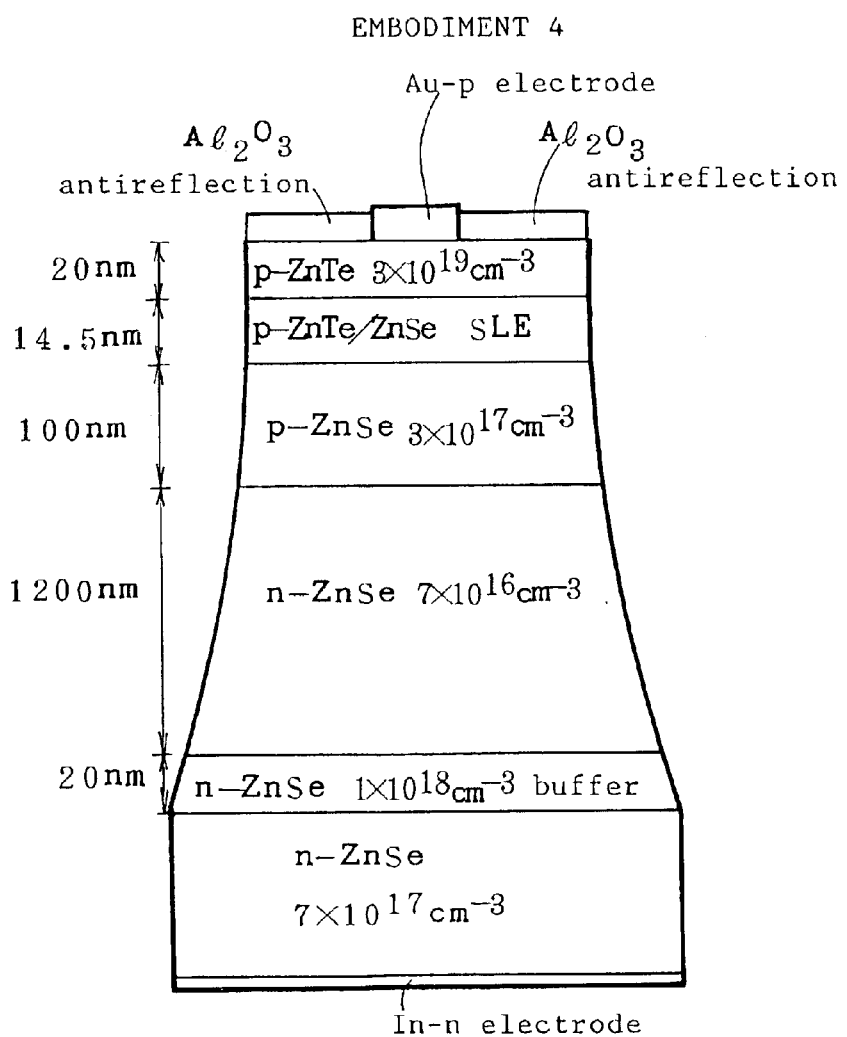
FIG. 19 is a layered structure of an avalanche photodiode of Embodiment 4 including an n-ZnSe substrate, an n-ZnSe buffer layer, an n-ZnSe avalanche amplifying layer, a p-ZnSe layer, a p-(ZnTe/ZnSe)$^m$ superlattice electrode, a p-ZnTe contact layer, an Al$_2$O$_3$ antireflection layer, an Au p-electrode on the top, and an In n-electrode on the bottom.

[Embodiment 4 (ZnSe Avalanche-PD; FIG. 19)]

Embodiment 4 is an APD having an n-ZnSe substrate, a p-ZnSe layer and an n-ZnSe buffer layer. Table 6 and FIG. 19 show a layered structure of Embodiment 4 APD. The APD has a mesa shape with a wider bottom and a narrower top. Sides of upper layers are slightly etched into the mesa-shape. The etched sides are coated with passivation films for protecting a pn-junction and the upper layers. Description of light sensing properties precedes manufacturing of the avalanche photodiode.

TABLE 6

Layered structure of (blue-ultraviolet) ZnSe-APD of Embodiment 4

| | Material | Thickness/concentration |
|---|---|---|
| Protection layer | $Al_2O_3$ | |
| P-electrode | Au | |
| P-contact layer | p-ZnTe | 20 nm<br>p = 3 × $10^{19}$ cm$^{-3}$ |
| Superlattice electrode | p-(ZnTe/ZnSe)$^m$ | 14.5 nm |
| P-layer | p-ZnSe | 100 nm<br>p = 3 × $10^{17}$ cm$^{-3}$ |
| N-layer | n-ZnSe | 1200 nm<br>n = 7 × $10^{16}$ cm$^{-3}$ |
| N-buffer layer | n-ZnSe | 20 nm<br>n = $10^{18}$ cm$^{-3}$ |
| Substrate | n-ZnSe | n = 7 × $10^{17}$ cm$^{-3}$ |
| N-electrode | In | |

The n-ZnSe layer is so thick (1200 nm) that the n-ZnSe layer can fully absorb incidence light without loss and convert the light to electron-hole pairs. In addition to the absorption, the n-ZnSe layer should accelerate the holes and electrons by an electric field. For the purpose, the n-ZnSe which has poor n(electron)-density (7×$10^{16}$ cm$^{-3}$) is reverse biased for producing an n-depletion layer originating from a pn-junction. Another thinner p-depletion layer is also formed in the p-ZnSe layer (3×$10^{17}$ cm$^{-3}$). The depletion layers can keep the electric field for accelerating carriers.

An increment of the reverse bias induces an increase of the thickness d of the depletion layers in proportion to the square of the bias. Too high reverse bias incurs instability of the electric field in the depletion layers. The electric field instability restricts the applicable reverse bias. A thick 800 nm layer is a suitable n-depletion layer for an avalanche photodiode.

Depletion layers extend both upward in the upper p-layer and downward in the lower n-layer. The depletion layer is thicker in lower dopant density, because the thickness is in reverse-proportion to the dopant density. In the case of a pn⁻ type (minus sign "−" means poor dopant density), the n-depletion layer extending in the carrier-poor n-layer is more significant than the p-depletion layer in the carrier-rich p-layer. The dielectric constant of the p- and n-layers is denoted by $\epsilon$. The donor density (=dopant density) is indicated by $N_d$ in the n-layer. The reverse bias applied to the n-depletion in the n-layer is denoted by $V_n$. The thickness of the n-depletion layer is denoted by $t_n$. The Gauss law ($\Delta\epsilon E = -\rho$,) gives an equation, $$2\epsilon V_n = q N_d t_n^2, \qquad (1)$$

where q is a unit electric charge. A similar relation holds in the p-depletion layer. $\epsilon$ is a dielectric constant. "$N_a$" is an acceptor density in the p-layer. "$V_p$" is a reverse bias applied to the p-layer, and "$t_p$" is a thickness of the p-depletion layer. The Gauss law gives $$2\epsilon V_p = q N_a t_p^2. \qquad (2)$$

A boundary condition is that the electric flux $N_d t_n$ and $N_a t_p$ are continual at the boundary (pn-junction).

$$N_d t_n = N_a t_p. \qquad (3)$$

The total reverse bias V is a sum of $V_n$ and $V_p$.

$$V = V_n + V_p. \qquad (4)$$

Eqs. (1), (2), (3) and (4) determine the depletion layer thicknesses.

$$t_p = \sqrt{\frac{2\varepsilon V N_d}{q N_a (N_d + N_a)}} \qquad (5)$$

$$t_n = \sqrt{\frac{2\varepsilon V N_a}{q N_d (N_d + N_a)}} \qquad (6)$$

Electric fields begin to rise linearly from zero at the farther ends of the layers both in the n-layer and in the p-layer and attain to a maximum at the pn-junction (boundary between the n-layer and the p-layer). $E_n$ and $E_p$ denote the electric fields of the n-layer and the p-layer at the pn-junction. Integration of the Gauss law gives $E_n = q t_n N_d / \epsilon$ and $E_p = q t_p N_a / \epsilon$. Since the electric field is continual at the pn-junction.

$$E_n = E_p = \sqrt{\frac{2qV N_a N_d}{\varepsilon(N_d + N_a)}} \qquad (7)$$

By an introduction of an acceptor/donor ratio $\xi = N_a/N_d$, the equations can be simplified as $$t_p = \sqrt{\frac{2\varepsilon V}{q\xi(\xi+1)N_d}}, \qquad (8)$$

$$t_n = \sqrt{\frac{2\varepsilon V \xi}{q N_d(\xi+1)}}, \qquad (9)$$

and $$E_n = E_p = \sqrt{\frac{2qV\xi N_d}{\varepsilon(\xi+1)}}. \qquad (10)$$

ZnSe gives a dielectric constant $\epsilon = 8 \times 0.88 \times 10^{-13}$ F/cm. Further calculations require concrete values of the donor density $N_d$ and the acceptor density $N_a$. For example, when $N_d = 7 \times 10^{16}$ cm$^{-3}$, $$t_p = 110 \times \sqrt{\frac{V}{\xi(1+\xi)}}, \quad (\text{nm}) \qquad (11)$$

$$t_n = 110 \times \sqrt{\frac{V\xi}{(1+\xi)}}, \quad (\text{nm}) \qquad (12)$$

and $$E_n = E_p = 1.77 \times 10^5 \sqrt{\frac{V\xi}{\xi+1}}. \quad (\text{V/cm}) \qquad (13)$$

The $N_d = 7 \times 10^{16}$ cm$^{-3}$ means an assumption of a quite low donor density. A higher or lower donor density than $N_d = 7 \times 10^{16}$ cm$^{-3}$ can be available for the APDs of the present invention. Further estimation requires a concrete acceptor density $N_a$. When $N_a = 3 \times 10^{17}$ cm$^{-3}$ which means $\xi = 4.3$, $$t_p = 23 \times V^{1/2} \text{ (nm)}, \qquad (14)$$

$$t_n = 100 \times V^{1/2} \text{ (nm)}, \qquad (15)$$

and $$E_n = E_p = 1.6 \times 10^5 V^{1/2} \text{ (V/cm)}. \qquad (16)$$

The voltage is a sum of an external reverse bias and a natural bias (built-in voltage). The natural built-in voltage is generated from a difference of the valence band and the conduction band which is originated from the equalization of the Fermi levels of the n-layer and the p-layer. The built-in voltage is less than the bandgap and depends upon the dopant densities.

The p-depletion layer is quite thin, since the p-layer has higher dopant (acceptor) density $N_a$. Most of the depletion layer is made in the n-layer of the low dopant density. The thickness ratio of the p-depletion layer to the n-depletion layer is $\xi$. Almost all the reverse bias is applied to the n-depletion layer. Electric field exclusively acts on the n-depletion layer. In the n-depletion layer, electrons and holes generated by light are driven by the strong electric field. The electrons are pulled and accelerated toward an n-electrode (to an n-type substrate). The holes are driven and accelerated toward the p-layer. The accelerated holes and electrons bombard lattice atoms and yield electrons or holes. The sequential regeneration of the carriers induces avalanche current flow. Thus, the PD is called an avalanche photo diode.

An Indium (In) n-electrode is formed on the bottom of the n-ZnSe substrate. A top $Al_2O_3$ film is a transparent protection film. The $Al_2O_3$ plays a role of an antireflection film for a predetermined wavelength. A gold (Au) metallic electrode should be formed upon the top p-ZnSe contact layer. But, any p-ZnSe cannot make an ohmic contact with a metallic p-electrode. ZnTe which has a narrow bandgap is a convenient compound which can be easily converted into p-type and can make the ohmic contact with the p-electrode due to the narrow bandgap. Thus, the top layer of the p-region is a p-ZnTe layer with high hole concentration (p>$10^{19}$ cm$^{-3}$) for reducing a contact resistance. Thus, the Au p-electrode is formed upon the ZnTe top layer. However, the narrow bandgap allows ZnTe to absorb incidence light. Reduction of the absorption loss requires thinner ZnTe layers. Embodiment 4 chooses a thin p-ZnTe of a 20 nm thickness for contacting ohmically to the Au p-electrode.

The top contacting p-layer is p-ZnTe and the p-layer of the lower pin-structure is the p-ZnSe layer. A direct coupling of the top p-ZnTe layer and the p-ZnSe layer would inhibit electrons and holes from flowing across the boundary owing to a large bandgap difference. A superlattice electrode SLE has been contrived for alleviating the large bandgap difference. The SLE is a pile of sets of p-ZnTe films and p-ZnSe films. The SLE is a kind of multiquantum well (MQW) having a ZnSe layer at the top and a ZnTe at the bottom as shown in FIG. 20. The SLE has the following structure from the top to the bottom.

| | |
|---|---|
| p-ZnSe | 2 nm |
| p-ZnTe | 1.5 nm |
| p-ZnSe | 2 nm |
| p-ZnTe | 1.2 nm |
| p-ZnSe | 2 nm |
| p-ZnTe | 0.9 nm |
| p-ZnSe | 2 nm |
| p-ZnTe | 0.6 nm |
| p-ZnSe | 2 nm |
| p-ZnTe | 0.3 nm |

The total thickness is 14.5 nm. The SLE has ten films containing five pairs of ZnSe and ZnTe films. All the five ZnSe films have a common 2 nm thickness. But, the ZnTe films have decreasing thicknesses (1.5 nm, 1.2 nm, 0.9 nm, 0.6 nm and 0.3 nm) from the top to the bottom for decreasing an effective bandgap from the value of ZnTe to the value of ZnSe. The ten (ZnSe/ZnTe) films are made by the MBE (molecular beam epitaxy) method. The p-dopant is nitrogen which is supplied by a cracker cell (or a nitrogen radical cell).

[Forward Current of Embodiment 4 APD]

Figure 21:
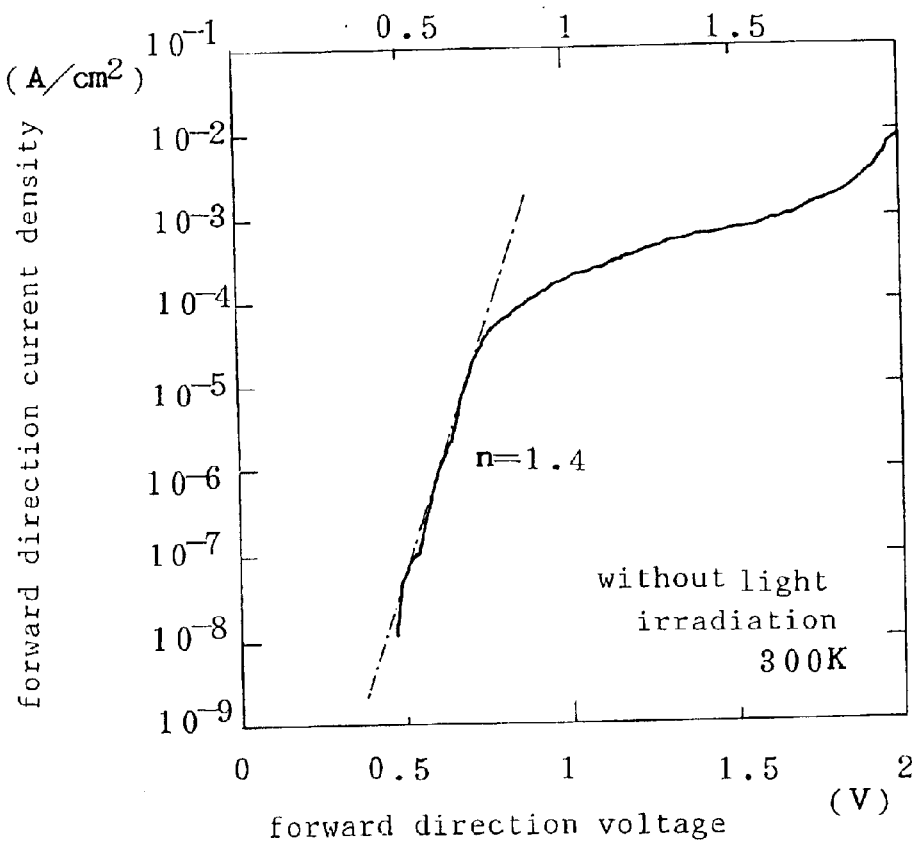
FIG. 21 is a graph showing a relation between forward bias and forward current density without illumination of Embodiment 4 APD for confirming rectifying property. The abscissa is forward bias voltage (V). The ordinate is forward current density (A/cm$^2$).

FIG. 21 shows a result of measurement of forward current of the Embodiment 4 ZnSe-APD. The anode (p-electrode) is connected to a positive pole of a DC source. The cathode (n-electrode) is connected to a negative pole of the source. The forward current is measured at 300K without irradiation. The abscissa is a forward voltage (V). The ordinate is a forward current density (A/cm$^2$) in a logarithmic scale. Between 0.5 V and 0.7 V of the forward voltage, the forward current density exhibits logarithmic behavior. A dotted straight line is an approximation. But, the forward current density deviates from the logarithmic increase beyond 0.7 V. The factor n is calculated from the inclination of the approximating dotted line by equalizing the dotted line to the typical pn-junction forward crossing current formula {exp(nq V/2 kT)-1}, where q is the elementary charge, n is the object factor, V is the forward voltage, k is the Boltzmann's constant and T is an absolute temperature. The forward current is sufficient in the APD.

[Forward Photocurrent of Embodiment 4 APD Under Illumination]

Figure 22:
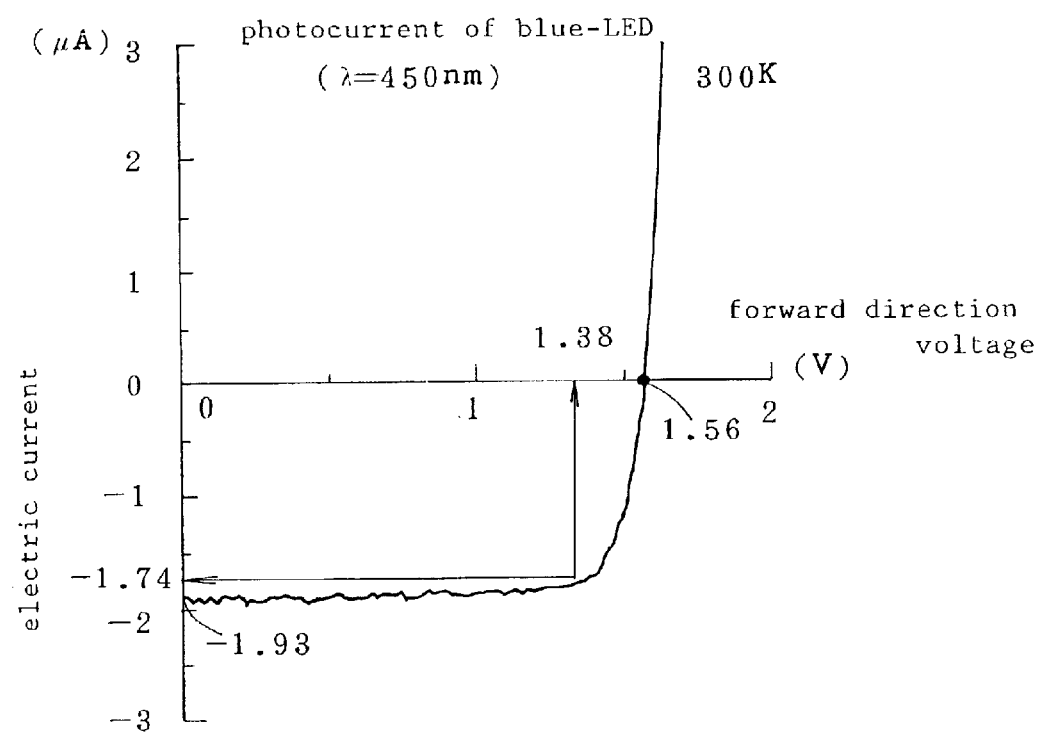
FIG. 22 is a graph showing a relation between forward bias voltage (V) and forward current (μA) with illumination of 450 nm LED light of Embodiment 4 APD.

FIG. 22 shows a result of measurement of forward photocurrent of the Embodiment 4 ZnSe-APD which is irradiated by a blue light LED (λ=450 nm) at 300K. The abscissa is a forward voltage Vf (V) applied between the anode and the cathode of the APD. The ordinate is forward photocurrent ($\mu$A) in a normal scale. A 0V forward voltage allows photocurrent of −1.93 $\mu$A to flow across the pn-junction in a reverse direction. The photocurrent is induced by the irradiation of the LED and is increased in proportion to the power of the LED blue light. The −1.93 $\mu$A reverse current at Vf=0 is photocurrent which is caused by the incidence light yielding pairs of electrons and holes, and inner built-in voltage pushing the electrons to the n-layer and the holes to the p-layer.

Without reverse bias, the built-in voltage (generated by the difference of the conduction/valence band) existing at the pn-junction drives the electrons toward the n-electrode and the holes toward the p-electrode. Even when a small forward bias less than 1.38 V is applied, about −1.8$\mu$A photocurrent still flows in the reverse direction. The inner built-in voltage prevails over the applied forward bias in the range. A forward bias of Vf=1.38V cancels the built-in voltage. When the forward applied voltage is Vf=1.56V, the applied voltage cancels the inner built-in voltage and the photocurrent vanishes. For forward applied voltage Vf>1.56V, photocurrent begins to flow in the forward direction.

[Reverse Dark Current and Photocurrent of Embodiment 4 APD]

Figure 23:
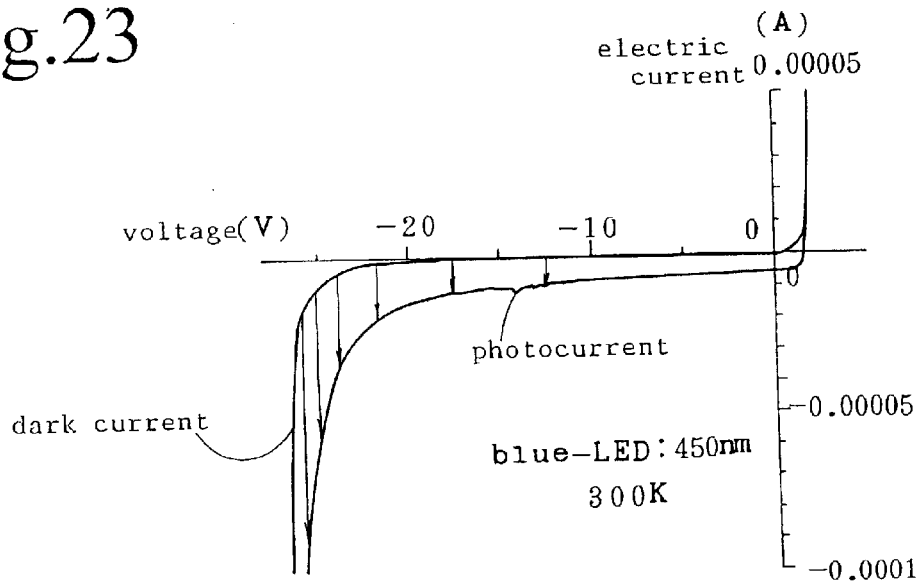
FIG. 23 is a graph showing photocurrent and dark current as a function of bias voltage of Embodiment 4 APD. The dark current and the photocurrent rise at a −20 V reverse bias. The fall of the curve denotes the breakdown voltage is about −27V.

FIG. 23 shows dark current and photocurrent of the APD of Embodiment 4 which is reversely biased. The surrounding temperature is 300K. The abscissa is a bias voltage (V) in which reverse bias is denoted by a minus region. The ordinate is photocurrent (A) in the forward direction. An upper curve denotes dark current. A lower curve indicates photocurrent of the APD irradiated by a blue-light LED of a 450 nm wavelength. What is important is the difference between the dark current and the photocurrent in the third zone (V<0 and I<0).

The dark current is zero from 0V reverse bias to −20V reverse bias. The dark current increases at −25V reverse bias. A −27V reverse bias enhances the dark current abruptly. The −27V is a breakdown voltage Vbk. The breakdown voltage is an important parameter for defining an avalanche photodiode.

The lower curve denotes photocurrent of the APD illuminated by the blue LED. A small positive bias allows a small negative photocurrent, which corresponds to FIG. 22. When a negative bias from 0 V to −20 V is applied, the photocurrent is about −4 $\mu$A to −10 $\mu$A. When the reverse bias reaches about −20V, the photocurrent begins to rise in the negative direction (reverse bias direction). At −23 V reverse bias, the photocurrent enhances abruptly. This is an avalanche amplification. Since the dark current is also avalanche-amplified, substantial photocurrent should be obtained by substituting the measured photocurrent by the amplified dark current. Downward arrows in FIG. 23 show the difference between the measured photocurrent and the dark current. The lengths of the downward arrows mean the substantial (net) photocurrent. The reverse bias should be set at a pertinent negative voltage larger than −27 V which is the breakdown voltage Vbk. In general, APDs are used under a strong reverse bias a little below the breakdown voltage. The ZnSe-APD of Embodiment 4 having a −27 Vbk should be applied by −20 V to −25V reverse bias.

[Quantum Efficiency of the ZnSe-APD of Embodiment 4]

Figure 24:
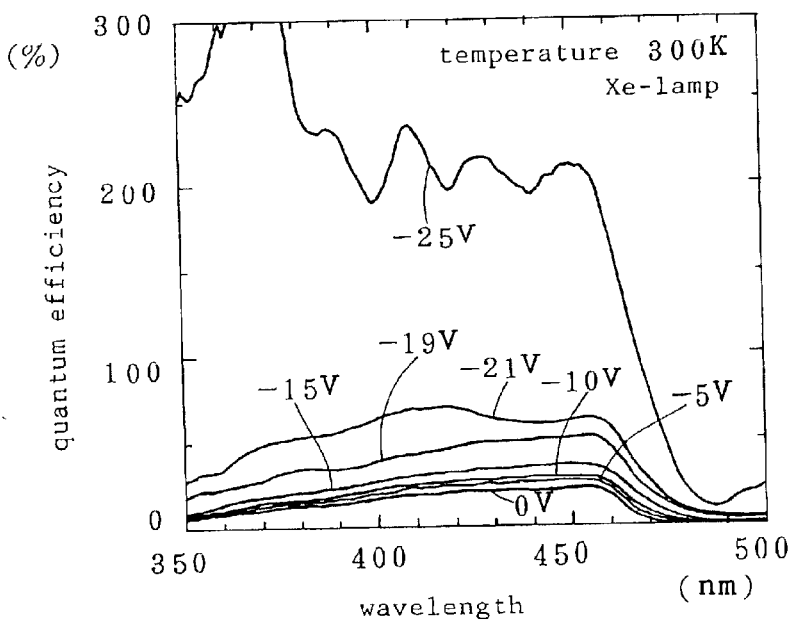
FIG. 24 is a graph showing external quantum efficiency of Embodiment 4 APD measured at 300 K under Xe lamp illumination as a function of wavelength with a parameter of the reverse bias.

FIG. 24 shows a result of measurements of quantum efficiency of the ZnSe-APD of Embodiment 4 for different wavelengths with a reverse bias as a parameter at 300K. A Xe-lamp is the light source for illuminating the APD. Ultraviolet-blue light of the Xe-lamp is converted into monochromatic light by a spectrometer. The wavelength range of the measurements is from 350 nm to 500 nm. The abscissa is a wavelength of illuminating light. The ordinate is external quantum efficiency. The reverse biases are 0V, −5V, −10V, −15V, −19V, −21V and −25V from the bottom to the top.

Without reverse bias, the APD takes a maximum quantum efficiency of 20% at a 456 nm wavelength. An increase of the wavelength over 456 nm decreases the quantum efficiency. The quantum efficiency falls to zero at a 475 nm wavelength. The fall corresponds to the bandgap (λ.g=465 nm) of ZnSe. In general, the quantum efficiency slowly decreases at the wavelengths less than 460 nm.

An increment of the reverse bias raises the quantum efficiency. In any bias, the quantum efficiency takes a peak value at a 456 nm wavelength. A −5V reverse bias gives 25% quantum efficiency. A −10V reverse bias shows 29% quantum efficiency. A −15V reverse bias gives 37% of quantum efficiency. A −19V reverse bias shows 51% of quantum efficiency. A −21V reverse bias reveals 62% of quantum efficiency.

The common 456 nm peak corresponds to the bandgap of ZnSe. A strong reverse bias more than −21V enhances the photocurrent for shorter wavelengths than 456 nm.

At −25V reverse bias slightly below the breakdown voltage of −27V, the quantum efficiency of 456 nm attains to 207%. The quantum efficiency in a shorter range than 456 nm oscillates in a wide region which is still higher than 207%. There are a plurality of conduction bands. Strong reverse biases induce new transitions from the valence band to several higher conduction bands and oscillate the quantum efficiency at the appearance of the edges of the higher conduction bands. The quantum efficiency sometimes rises over 300%. A −25V reverse bias raises the quantum efficiency up to 200% in a wide wavelength range. That is an evidence of the avalanche amplification of the photocurrent in the APD of Embodiment 4.

[Field dependence of the Amplifying Rate of the ZnSe-APD of Embodiment 4]

The amplifying rate of an avalanche photodiode rises just before the breakdown voltage Vbk. The change of the amplifying rate (quantum efficiency) has been described as a function of the total reverse bias voltage applied between the n-electrode and the p-electrode in the preceding chapter. However, the total voltage applied between the anode and the cathode is perturbed by changes of layer thicknesses and dopant densities. Actual driving force acting upon holes and electrons is not the total reverse bias but a local electric field existing in the depletion layers. Relation of the amplifying rate to the local electric field is further examined.

Figure 25:
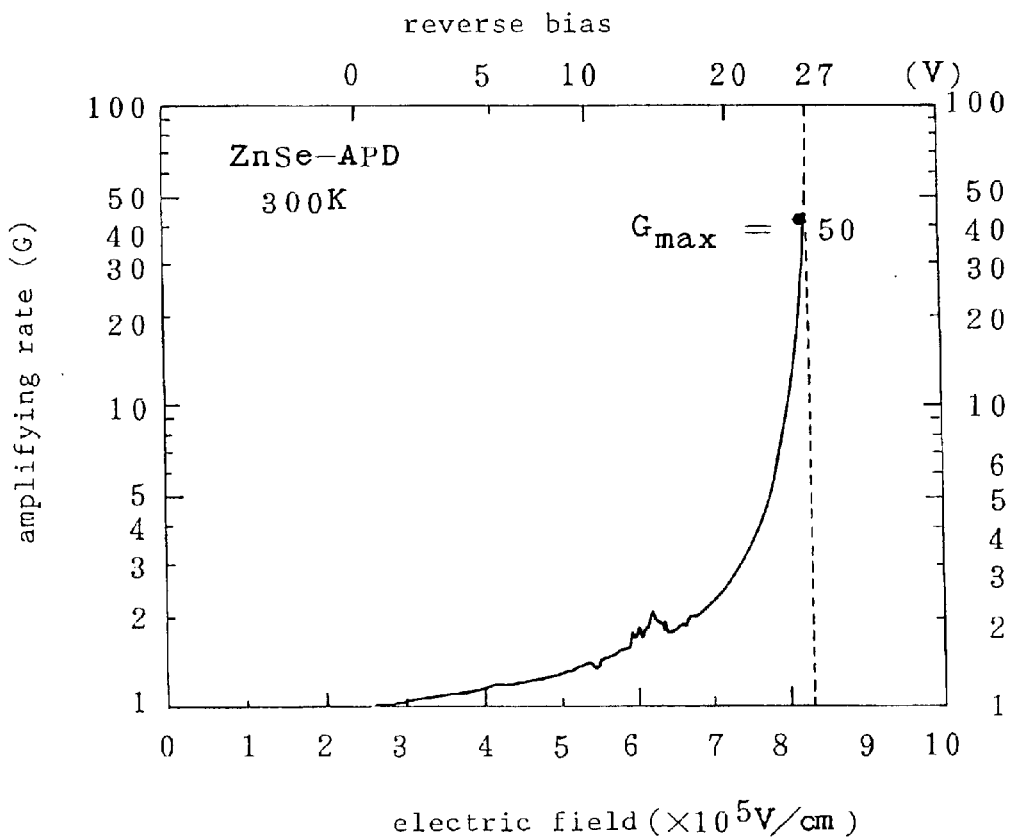
FIG. 25 is a graph showing an amplification rate G of Embodiment 4 APD as a function of an electric field (×10$^5$ V/cm) acting on a pn-junction and an equivalent reverse bias (V).

FIG. 25 is a graph of indicating a change of the amplifying rate of the ZnSe-APD of Embodiment 4 as a function of the local electric field. The lower abscissa is an electric field $E_n$ ($\times 10^5$ V/cm). The upper abscissa is a total reverse bias $V_b$ (V). Since Embodiment 4 has a definite layered structure, the relation between the local electric field $E_n$ and the total reverse bias $V_b$ is uniquely determined as explained later. A different layered structure will give a different $V_b$-$E_n$ relation of course.

In spite of a 0 reverse bias, an inherent local electric field of $2.3 \times 10^5$ V/cm is induced by an energy difference between the conduction band and the valence band for equalizing the Fermi levels of the p- and n-layers. The lower abscissa $E_n$ is equidistantly numbered. The upper abscissa $V_b$ is inequidistantly numbered. The ordinate is an amplifying rate G. Eq. (16) clarifies the relation between the (pn-junction) electric field and the total bias at the donor density $N_d$ ($7 \times 10^{16}$ cm$^{-3}$) and the acceptor density $N_a$ ($3 \times 10^{17}$ cm$^{-3}$) of Embodiment 4. The total bias V is a sum of an inherent bias (about 2.3 V) and an external reverse bias $V_b$ ($V=V_b+2.3$). Eq. (16) is rewritten to $$E_n = E_p = 1.6 \times 10^5 \times (V_b + 2.3)^{1/2}. \quad (17)$$

Eq. (17) gives a definite relation between the upper abscissa ($V_b$) and the lower abscissa $E_n$ which is the electric field at the pn-junction in FIG. 25. The inner electric field rises in proportion to a root of the applied reverse bias. The rising rate is small at the beginning of application of the reverse bias. When the reverse bias exceeds 14V which corresponds with $E_n=6 \times 10^5$ V/cm, the amplifying rate begins to rise rapidly. A $7 \times 10^5$ V/cm electric field gives the amplifying rate G=2. At an $8 \times 10^5$ V/cm electric field, the amplifying rate G increases to eight. At an $8.3 \times 10^5$ V/cm electric field, the amplifying rate G abruptly enhances up to 50 times ($G_{max}=50$) as much as the initial one. Such a high gain ($G_{max}=50$) at the $8.3V \times 10^5$ V/cm electric field confirms that Embodiment 4 acts as an avalanche photodiode. The $8.3V \times 10^5$ V/cm electric field corresponds to the 27V reverse bias which is the limit of the breakdown voltage.

When the layered structure of the Embodiment 4 avalanche PD is made by the before-described CVT method as illustrated in FIGS. 6 and 7 and by the MBE method as shown in FIG. 8, the growth temperature is 200° C. to 380° C. 6/2 group volume ratio (Se/Zn, S/Zn, etc.) is 1 to 5. The growth speed is 0.1 µm/H to 1 µm/H. Embodiment 4 grows a 20 nm n-ZnSe buffer layer, a 1200 nm n-ZnSe layer, a 100 nm p-ZnSe layer, a 14.5 nm (ZnTe/ZnSe)$^m$ superlattice electrode and a 20 nm p-ZnTe layer in series on an n-ZnSe substrate in the MBE apparatus.

A p-electrode made of gold (Au) is formed upon a p-ZnTe contact layer on the ZnSe epitaxial wafer. The p-electrode is a small dot or an annulus for ensuring a wide aperture to allow sufficient incidence light to enter. An n-electrode made of indium (In) is formed on the bottom of the n-ZnSe substrate. Then, the epitaxial ZnSe wafer is scribed and cut lengthwise and crosswise into individual APD chips. Pn-junction revealing on the side is too defective to apply reverse bias. The sides of an upper part of the chips are etched into a mesa shape (as shown in FIG. 19). Table 7 denotes components of an etchant and the etching condition for mesa-etching the sides.

TABLE 7

Etchant and etching condition
Sulfuric acid & hydrogen peroxide etchant

| | |
|---|---|
| Sulfuric acid ($H_2SO_4$) | 5 |
| Hydrogen peroxide ($H_2O_2$) | 1 |
| Pure water ($H_2O$) | 1 |
| Etching temperature | 60° C. |
| Etching rate | 2.0 µm/min |

The mesa-etched sides of the APD chips are coated with insulating films, e.g., an $Al_2O_3$ film, an $SiO_2$ film, an $HfO_2$ film, an SiN film, a $TiO_2$ film or a set of the films. The pn-junction is fully protected by the insulating, protecting film. The protected pn-junction enables strong reverse bias to build wide depletion layers in the APD.

The mesa-etched and side-film-coated APD chip is mounted with the n-electrode down upon a package with leads. The top p-electrode is joined to a lead by a wire. An APD is produced by mounting a lens with a sleeve and sealing the package with a cap. The quantum efficiency, the amplifying rate and other properties of the APD have been described before.

Figure 26:
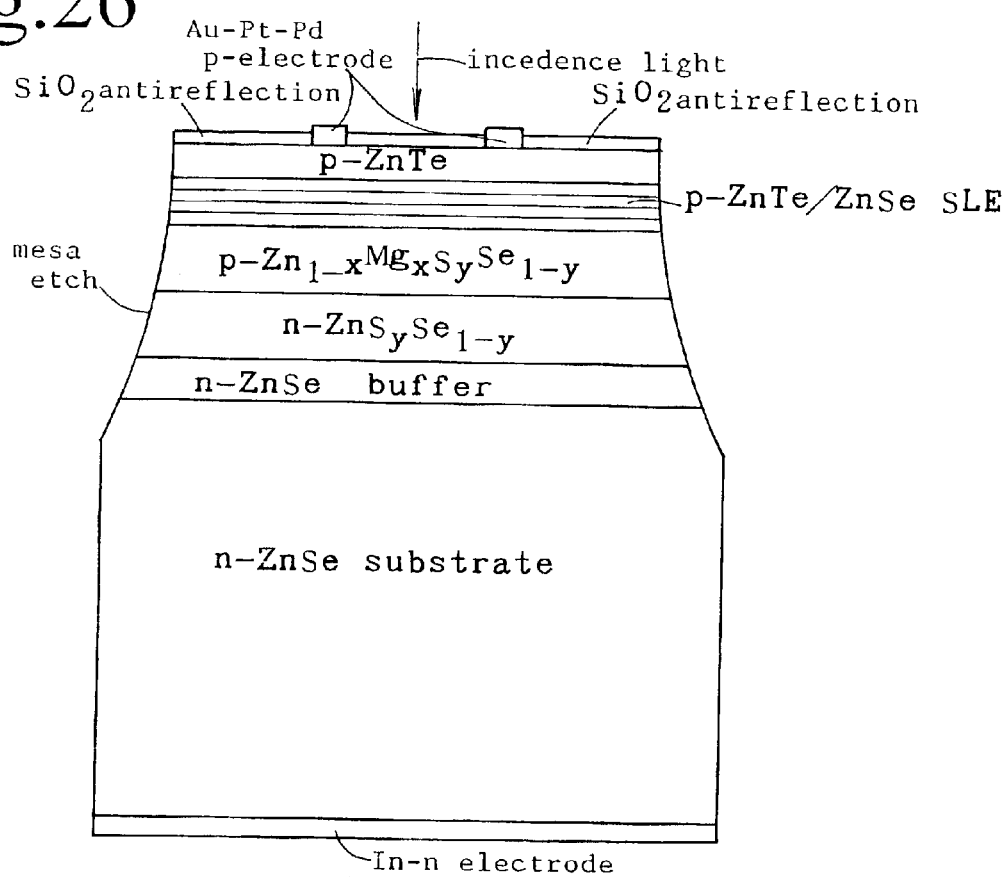
FIG. 26 is a layered structure of Embodiment 5 having an n-ZnSe substrate, an n-ZnSe buffer layer, an n-ZnSSe layer, a p-ZnMgSSe layer, a p-(ZnTe/ZnSe)$^m$ superlattice electrode (SLE), a p-ZnTe layer, an SiO$_2$ protecting layer, an Au/Pt/Pd p-electrode, and an In n-electrode.

[Embodiment 5 (ZnMgSSe/ZnSSe; FIG. 26)]

Embodiment 4 employs ZnSe for the sensing layers(p-, n-layers) which have a slightly narrow bandgap (2.65 eV; 465 nm). Thus, Embodiment 4 has a problem of shortage of sensitivity for shorter wavelength light. Replacement of sensitivity range to shorter wavelengths requires an inclusion of Mg and S which partially replace Zn and Se respectively.

Embodiment 5 aims at making an APD which has sufficient sensitivity for shorter wavelength than Embodiment 4. Embodiment 5 gives $Zn_{1-x}Mg_xS_ySe_{1-y}$ to the p-layer and $ZnS_ySe_{1-y}$ to the n-layer instead of ZnSe. The mixture ratio y of S and the mixture ratio x of Mg are 0 to 0.8 in the present invention. The ratios x and y should be chosen on the condition of satisfying the lattice fitting to the ZnSe substrate. For example, x=0.1 and y=0.2 are suitable. The bandgap is widened by selecting $Zn_{1-x}Mg_xS_ySe_{1-y}$ to the component layers. The sensitivity range can be extended into near-ultraviolet region by the increment of the bandgap. FIG. 26 shows the layered structure of Embodiment 5 from the top to the bottom.

Au—Pt—Pd-electrode (ring-shaped p-electrode)
$SiO_2$ protection/antireflection layer
p-ZnTe contact layer
p-ZnSe/ZnTe SLE superlattice electrode
p-$Zn_{1-x}Mg_xS_ySe_{1-y}$ layer
n-$ZnS_ySe_{1-y}$ layer
n-ZnSe buffer layer
In-electrode (n-electrode)

As mentioned before, the depletion layers are made both in the p-layer and the n-layer. Since the n-layer is poorer doped, the n-depletion layer is far thicker than the p-depletion layer. Incidence light is absorbed both in the p-depletion layer($Zn_{1-x}Mg_xS_ySe_{1-y}$) and the n-depletion layer ($ZnS_ySe_{1-y}$). But, the absorption in the n-depletion layer is more significant than the absorption in the p-depletion layer. The employment of $Zn_{1-x}Mg_xS_ySe_{1-y}$ for the p-layer is another object for decreasing the absorption in the p-layer, increasing the light power which arrives at the n-depletion layer, and raising the sensitivity. Other structure of Embodiment 5 is similar to Embodiment 4. The chip of Embodiment 5 is also side-etched into a mesa-shape. Incidence light goes into the APD through an aperture enclosed by the ring p-electrode. The $SiO_2$ protection film covers except the ring-shaped p-electrode. It is confirmed that the Embodiment 5 APD has enough the sensitivity for the near-ultraviolet light.

What we claim is:

1. A $Zn_{1-x}Mg_xS_ySe_{1-y}$ pin-photodiode comprising:
   an n-ZnSe single crystal substrate;
   an n-$Zn_{1-x}Mg_xS_ySe_{1-y}$ ($0 \leq x \leq 0.8; 0 \leq y \leq 0.8$) layer epitaxially grown either directly upon the n-ZnSe substrate or via an n-ZnSe buffer layer piled upon the n-ZnSe substrate;
   an i-$Zn_{1-x}Mg_xS_ySe_{1-y}$ ($0 \leq x \leq 0.8; 0 \leq y \leq 0.8$) layer epitaxially grown the n-$Zn_{1-x}Mg_xS_ySe_{1-y}$ layer;
   a p-$Zn_{1-x}Mg_xS_ySe_{1-y}$ ($0 \leq x \leq 0.8; 0 \leq y \leq 0.8$) layer having a bandgap equal to or wider than a bandgap of the i-$Zn_{1-x}Mg_xS_ySe_{1-y}$ layer;
   a p-(ZnTe/ZnSe)$^m$ superlattice electrode which is made by piling p-ZnTe thin films and p-ZnSe thin films reciprocally;
   a metallic p-electrode formed upon the p-(ZnTe/ZnSe)$^m$ superlattice electrode; and
   a metallic n-electrode formed on the bottom of the n-ZnSe substrate.

2. The $Zn_{1-x}Mg_xS_ySe_{1-y}$ pin-photodiode according to claim 1, wherein an n-ZnSe buffer layer is formed between the n-ZnSe substrate and the n-$Zn_{1-x}Mg_xS_ySe_{1-y}$ layer.

3. The $Zn_{1-x}Mg_xS_ySe_{1-y}$ pin-photodiode according to claim 2, wherein the i-$Zn_{1-x}Mg_xS_ySe_{1-y}$ layer has impurity concentration less than $10^{16}$ cm$^{-3}$.

4. The $Zn_{1-x}Mg_xS_ySe_{1-y}$ pin-photodiode according to claim 3, wherein the n-$Zn_{1-x}Mg_xS_ySe_{1-y}$ layer is an n-ZnSe layer containing neither Mg nor S (x=0, y=0), the i-$Zn_{1-x}Mg_xS_ySe_{1-y}$ layer is an i-ZnSe layer containing neither Mg nor S (x=0, y=0), and the p-$Zn_{1-x}Mg_xS_ySe_{1-y}$ layer is a p-ZnSe layer containing neither Mg nor S (x=0, y=0).

5. The $Zn_{1-x}Mg_xS_ySe_{1-y}$ pin-photodiode according to claim 4, wherein external quantum efficiency is more than 60% for light of a wavelength between 460 nm and 400 nm.

6. The $Zn_{1-x}Mg_xS_ySe_{1-y}$ pin-photodiode according to claim 3, wherein the n-$Zn_{1-x}Mg_xS_ySe_{1-y}$ layer is an n-ZnSe layer containing neither Mg nor S (x=0, y=0), the i-$Zn_{1-x}Mg_xS_ySe_{1-y}$ layer is an n-$ZnS_ySe_{1-y}$ layer containing no Mg (x=0), and the p-$Zn_{1-x}Mg_xS_ySe_{1-y}$ layer including both Mg and S ($0 \leq x \leq 0.8; 0 \leq y \leq 0.8$) and acting as an window layer.

7. The $Zn_{1-x}Mg_xS_ySe_{1-y}$ pin-photodiode according to claim 6, wherein external quantum efficiency is more than 40% for light of a wavelength between 460 nm and 300 nm.

8. The $Zn_{1-x}Mg_xS_ySe_{1-y}$ pin-photodiode according to claim 3, wherein the n-$Zn_{1-x}Mg_xS_ySe_{1-y}$ layer is an n-ZnSe layer containing neither Mg nor S (x=0, y=0), the i-$Zn_{1-x}Mg_xS_ySe_{1-y}$ layer is an i-ZnSe layer containing neither Mg nor S (x=0, y=0), and the p-$Zn_{1-x}Mg_xS_ySe_{1-y}$ layer is a p-$ZnS_ySe_{1-y}$ layer including S ($0 \leq y \leq 0.8$) but no Mg (x=0) and acting as an window layer.

9. The $Zn_{1-x}Mg_xS_ySe_{1-y}$ pin-photodiode according to claim 8, wherein external quantum efficiency is more than 40% for light of a wavelength between 460 nm and 300 nm.

10. The $Zn_{1-x}Mg_xS_ySe_{1-y}$ pin-photodiode according to claim 1, wherein a top surface of the p-ZnTe layer except the p-metallic electrode is coated with a mask made from $Al_2O_3$, $SiO_2$, $HfO_2$, $TiO_2$, $Ta_2O$, or SiN for antireflection and protection.

11. The $Zn_{1-x}Mg_xS_ySe_{1-y}$ pin-photodiode according to claim 4, wherein a top surface of the p-ZnTe layer except the p-metallic electrode is coated with a mask made from $Al_2O_3$, $SiO_2$, $HfO_2$, $TiO_2$, $Ta_2O_5$ or SiN for antireflection and protection.

12. The $Zn_{1-x}Mg_xS_ySe_{1-y}$ pin-photodiode according to claim 6, wherein a top surface of the p-ZnTe layer except the p-metallic electrode is coated with a mask made from $Al_2O_3$, $SiO_2$, $HfO_2$, $TiO_2$, $Ta_2O_5$ or SiN for antireflection and protection.

13. The $Zn_{1-x}Mg_xS_ySe_{1-y}$ pin-photodiode according to claim 8, wherein a top surface of the p-ZnTe layer except the p-metallic electrode is coated with a mask made from $Al_2O_3$, $SiO_2$, $HfO_2$, $TiO_2$, $Ta_2O_5$ or SiN for antireflection and protection.

14. A $Zn_{1-x}Mg_xS_ySe_{1-y}$ avalanche photodiode for inducing avalanche amplification by a strong electric field formed by applying a reverse bias slightly below a breakdown voltage, comprising;
    an n-ZnSe single crystal substrate;
    an low doped n-$Zn_{1-x}Mg_xS_ySe_{1-y}$ ($0 \leq x \leq 0.8; 0 \leq y \leq 0.8$) avalanche layer epitaxially grown either directly upon the n-ZnSe substrate or via an n-ZnSe buffer layer piled upon the n-ZnSe substrate;
    a p-$Zn_{1-x}Mg_xS_ySe_{1-y}$ ($0 \leq x \leq 0.8; 0y \leq 0.8$) layer having a bandgap equal to or wider than a bandgap of the low doped n-$Zn_{1-x}Mg_xS_ySe_{1-y}$ layer;
    a p-(ZnTe/ZnSe)$^m$ superlattice electrode which is made by piling p-ZnTe thin films and p-ZnSe thin films reciprocally;
    a metallic p-electrode formed upon the p-(ZnTe/ZnSe)$^m$ superlattice electrode;
    a metallic n-electrode formed on the bottom of the n-ZnSe substrate; and
    sides of the n-$Zn_{1-x}Mg_xS_ySe_{1-y}$ layer, the p-$Zn_{1-x}Mg_xS_ySe_{1-y}$ layer, and the p-superlattice electrode being etched into a mesa,
    the etched sides being coated with an insulating film.

15. The $Zn_{1-x}Mg_xS_ySe_{1-y}$ avalanche photodiode according to claim 14, wherein an n-ZnSe buffer layer is formed between the n-ZnSe substrate and the n-$Zn_{1-x}Mg_xS_ySe_{1-y}$ layer.

16. The $Zn_{1-x}Mg_xS_ySe_{1-y}$ avalanche photodiode according to claim 14, wherein the n-$Zn_{1-x}Mg_xS_ySe_{1-y}$ layer is an n-ZnSe layer containing neither Mg nor S (x=0, y=0) and the p-$Zn_{1-x}Mg_xS_ySe_{1-y}$ layer is a p-ZnSe layer containing neither Mg nor S (x=0, y=0).

17. The $Zn_{1-x}Mg_xS_ySe_{1-y}$ avalanche photodiode according to claim 14, wherein the n-$Zn_{1-x}Mg_xS_ySe_{1-y}$ layer is an n-ZnSe layer containing neither Mg nor S (x=0, y=0) and the p-$Zn_{1-x}Mg_xS_ySe_{1-y}$ layer is a p-$ZnS_ySe_{1-y}$ layer containing no Mg (x=0).

18. The $Zn_{1-x}Mg_xS_ySe_{1-y}$ avalanche photodiode according to claim 14, wherein the n-$Zn_{1-x}Mg_xS_ySe_{1-y}$ layer is an n-$ZnS_ySe_{1-y}$ layer containing no Mg (x=0) and the p-$Zn_{1-x}Mg_xS_ySe_{1-y}$ layer is a p-$Zn_{1-x}Mg_xS_ySe_{1-y}$ layer containing Mg (x≠0).

19. The $Zn_{1-x}Mg_xS_ySe_{1-y}$ avalanche photodiode according to claim 14, wherein a top surface of the p-ZnTe layer except the p-metallic electrode is coated with a mask made from $Al_2O_3$, $SiO_2$, $HfO_2$, $TiO_2$, $Ta_2O_5$ or SiN for antireflection and protection.

20. The $Zn_{1-x}Mg_xS_ySe_{1-y}$ avalanche photodiode according to claim 16, wherein a top surface of the p-ZnTe layer except the p-metallic electrode is coated with a mask made from $Al_2O_3$, $SiO_2$, $HfO_2$, $TiO_2$, $Ta_2O_5$ or SiN for antireflection and protection.

21. The $Zn_{1-x}Mg_xS_ySe_{1-y}$ avalanche photodiode according to claim 17, wherein a top surface of the p-ZnTe layer except the p-metallic electrode is coated with a mask made from $Al_2O_3$, $SiO_2$, $HfO_2$, $TiO_2$, $Ta_2O_5$ or SiN for antireflection and protection.

22. The $Zn_{1-x}Mg_xS_ySe_{1-y}$ avalanche photodiode according to claim 18, wherein a top surface of the p-ZnTe layer except the p-metallic electrode is coated with a mask made from $Al_2O_3$, $SiO_2$, $HfO_2$, $TiO_2$, $Ta_2O_5$ or SiN for antireflection and protection.

* * * * *